United States Patent
Allen et al.

(10) Patent No.: US 12,247,846 B2
(45) Date of Patent: Mar. 11, 2025

(54) TEMPERATURE DEPENDENT CALIBRATION OF MOVEMENT DETECTION DEVICES

(71) Applicant: Magic Leap, Inc.

(72) Inventors: Cuthbert Martindale Allen, Miramar, FL (US); Michael Derek Abbott, Weston, FL (US); Igor Levinsky, Tel Aviv (IL); Jeffrey Johnson, Tampa, FL (US); Shimon Goldstein, Coral Springs, FL (US); Aaron Mark Schuelke, Coral Springs, FL (US)

(73) Assignee: Magic Leap, Inc.

( * ) Notice: Subject to any disclaimer, the term of this patent is extended or adjusted under 35 U.S.C. 154(b) by 67 days.

(21) Appl. No.: 18/161,616

(22) Filed: Jan. 30, 2023

(65) Prior Publication Data
US 2023/0175866 A1 Jun. 8, 2023

Related U.S. Application Data

(62) Division of application No. 17/262,991, filed as application No. PCT/US2019/043099 on Jul. 23, 2019, now Pat. No. 11,598,651.
(Continued)

(51) Int. Cl.
*G01C 25/00* (2006.01)
*B81B 7/02* (2006.01)

(52) U.S. Cl.
CPC .............. *G01C 25/005* (2013.01); *B81B 7/02* (2013.01); *B81B 2201/0235* (2013.01); *B81B 2201/0242* (2013.01)

(58) Field of Classification Search
CPC . G01C 25/005; B81B 7/02; B81B 2201/0235; B81B 2201/0242; G01P 21/00
See application file for complete search history.

(56) References Cited

U.S. PATENT DOCUMENTS

| 4,344,092 A | 8/1982 | Miller |
| 4,652,930 A | 3/1987 | Crawford |

(Continued)

FOREIGN PATENT DOCUMENTS

| CN | 100416340 C | 9/2008 |
| CN | 101449270 A | 6/2009 |

(Continued)

OTHER PUBLICATIONS

"Decision of Rejection mailed on Jan. 5, 2023 with English translation", Chinese Patent Application No. 201880079474.6, (10 pages).
(Continued)

*Primary Examiner* — David J Bolduc
(74) *Attorney, Agent, or Firm* — Stephen M. De Klerk

(57) ABSTRACT

An electronics system has a board with a thermal interface having an exposed surface. A thermoelectric device is placed against the thermal interface to heat the board. Heat transfers through the board from a first region where the thermal interface is located to a second region where an electronics device is mounted. The electronics device has a temperature sensor that detects the temperature of the electronics device. The temperature of the electronics device is used to calibrate an accelerometer and a gyroscope in the electronics device. Calibration data includes a temperature and a corresponding acceleration offset and a corresponding angle offset. A field computer simultaneously senses a temperature, an acceleration and an angle from the temperature sensor, accelerometer and gyroscope and adjusts the measured data with the offset data at the same temperature. The field computer provides corrected data to a controlled system.

13 Claims, 8 Drawing Sheets

Related U.S. Application Data

(60) Provisional application No. 62/702,870, filed on Jul. 24, 2018.

(56) References Cited

U.S. PATENT DOCUMENTS

| | | | |
|---|---|---|---|
| 4,810,080 A | 3/1989 | Grendol et al. |
| 4,997,268 A | 3/1991 | Dauvergne |
| 5,007,727 A | 4/1991 | Kahaney et al. |
| 5,074,295 A | 12/1991 | Willis |
| 5,240,220 A | 8/1993 | Elberbaum |
| 5,251,635 A | 10/1993 | Dumoulin et al. |
| 5,410,763 A | 5/1995 | Bolle |
| 5,455,625 A | 10/1995 | Englander |
| 5,495,286 A | 2/1996 | Adair |
| 5,497,463 A | 3/1996 | Stein et al. |
| 5,659,701 A | 8/1997 | Amit et al. |
| 5,682,255 A | 10/1997 | Friesem et al. |
| 5,689,669 A | 11/1997 | Lynch |
| 5,826,092 A | 10/1998 | Flannery |
| 5,854,872 A | 12/1998 | Tai |
| 5,864,365 A | 1/1999 | Sramek et al. |
| 5,937,202 A | 8/1999 | Crosetto |
| 6,002,853 A | 12/1999 | De Hond |
| 6,012,811 A | 1/2000 | Chao et al. |
| 6,016,160 A | 1/2000 | Coombs et al. |
| 6,064,749 A | 5/2000 | Hirota et al. |
| 6,076,927 A | 6/2000 | Owens |
| 6,079,982 A | 6/2000 | Meader |
| 6,117,923 A | 9/2000 | Amagai et al. |
| 6,119,147 A | 9/2000 | Toomey et al. |
| 6,124,977 A | 9/2000 | Takahashi |
| 6,179,619 B1 | 1/2001 | Tanaka |
| 6,191,809 B1 | 2/2001 | Hori et al. |
| 6,219,045 B1 | 4/2001 | Leahy et al. |
| 6,243,091 B1 | 6/2001 | Berstis |
| 6,271,843 B1 | 8/2001 | Lection et al. |
| 6,362,817 B1 | 3/2002 | Powers et al. |
| 6,375,369 B1 | 4/2002 | Schneider et al. |
| 6,385,735 B1 | 5/2002 | Wilson |
| 6,396,522 B1 | 5/2002 | Vu |
| 6,414,679 B1 | 7/2002 | Miodonski et al. |
| 6,538,655 B1 | 3/2003 | Kubota |
| 6,541,736 B1 | 4/2003 | Huang et al. |
| 6,570,563 B1 | 5/2003 | Honda |
| 6,573,903 B2 | 6/2003 | Gantt |
| 6,590,593 B1 | 7/2003 | Robertson et al. |
| 6,621,508 B1 | 9/2003 | Shiraishi et al. |
| 6,690,393 B2 | 2/2004 | Heron et al. |
| 6,757,068 B2 | 6/2004 | Foxlin |
| 6,784,901 B1 | 8/2004 | Harvey et al. |
| 6,961,055 B2 | 11/2005 | Doak |
| 7,046,515 B1 | 5/2006 | Wyatt |
| 7,051,219 B2 | 5/2006 | Hwang |
| 7,076,674 B2 | 7/2006 | Cervantes |
| 7,111,290 B1 | 9/2006 | Yates, Jr. |
| 7,119,819 B1 | 10/2006 | Robertson et al. |
| 7,211,986 B1 | 5/2007 | Flowerdew et al. |
| 7,219,245 B1 | 5/2007 | Raghuvanshi |
| 7,382,288 B1 | 6/2008 | Wilson |
| 7,414,629 B2 | 8/2008 | Santodomingo |
| 7,431,453 B2 | 10/2008 | Hogan |
| 7,467,356 B2 | 12/2008 | Gettman et al. |
| 7,542,040 B2 | 6/2009 | Templeman |
| 7,573,640 B2 | 8/2009 | Nivon et al. |
| 7,653,877 B2 | 1/2010 | Matsuda |
| 7,663,625 B2 | 2/2010 | Chartier et al. |
| 7,724,980 B1 | 5/2010 | Shenzhi |
| 7,746,343 B1 | 6/2010 | Charaniya et al. |
| 7,751,662 B2 | 7/2010 | Kleemann |
| 7,758,185 B2 | 7/2010 | Lewis |
| 7,788,323 B2 | 8/2010 | Greenstein et al. |
| 7,804,507 B2 | 9/2010 | Yang et al. |
| 7,814,429 B2 | 10/2010 | Buffet et al. |
| 7,817,150 B2 | 10/2010 | Reichard et al. |
| 7,844,724 B2 | 11/2010 | Van Wie et al. |
| 8,060,759 B1 | 11/2011 | Arnan et al. |
| 8,120,851 B2 | 2/2012 | Iwasa |
| 8,214,660 B2 | 7/2012 | Capps, Jr. |
| 8,246,408 B2 | 8/2012 | Elliot |
| 8,353,594 B2 | 1/2013 | Lewis |
| 8,360,578 B2 | 1/2013 | Nummela et al. |
| 8,508,676 B2 | 8/2013 | Silverstein et al. |
| 8,547,638 B2 | 10/2013 | Levola |
| 8,605,764 B1 | 10/2013 | Rothaar et al. |
| 8,619,365 B2 | 12/2013 | Harris et al. |
| 8,696,113 B2 | 4/2014 | Lewis |
| 8,698,701 B2 | 4/2014 | Margulis |
| 8,733,927 B1 | 5/2014 | Lewis |
| 8,736,636 B2 | 5/2014 | Kang |
| 8,759,929 B2 | 6/2014 | Shiozawa et al. |
| 8,793,770 B2 | 7/2014 | Lim |
| 8,823,855 B2 | 9/2014 | Hwang |
| 8,847,988 B2 | 9/2014 | Geisner et al. |
| 8,874,673 B2 | 10/2014 | Kim |
| 9,010,929 B2 | 4/2015 | Lewis |
| 9,015,501 B2 | 4/2015 | Gee |
| 9,086,537 B2 | 7/2015 | Iwasa et al. |
| 9,095,437 B2 | 8/2015 | Boyden et al. |
| 9,239,473 B2 | 1/2016 | Lewis |
| 9,244,293 B2 | 1/2016 | Lewis |
| 9,244,533 B2 | 1/2016 | Friend et al. |
| 9,285,872 B1 | 3/2016 | Raffle et al. |
| 9,383,823 B2 | 7/2016 | Geisner et al. |
| 9,489,027 B1 | 11/2016 | Ogletree |
| 9,519,305 B2 | 12/2016 | Wolfe |
| 9,581,820 B2 | 2/2017 | Robbins |
| 9,582,060 B2 | 2/2017 | Balatsos |
| 9,658,473 B2 | 5/2017 | Lewis |
| 9,671,566 B2 | 6/2017 | Abovitz et al. |
| 9,671,615 B1 | 6/2017 | Vallius et al. |
| 9,696,795 B2 | 7/2017 | Marcolina et al. |
| 9,798,144 B2 | 10/2017 | Sako et al. |
| 9,874,664 B2 | 1/2018 | Stevens et al. |
| 9,880,441 B1 | 1/2018 | Osterhout |
| 9,918,058 B2 | 3/2018 | Takahasi et al. |
| 9,955,862 B2 | 5/2018 | Freeman et al. |
| 9,978,118 B1 | 5/2018 | Ozgumer et al. |
| 9,996,797 B1 | 6/2018 | Holz et al. |
| 10,018,844 B2 | 7/2018 | Levola et al. |
| 10,082,865 B1 | 9/2018 | Raynal et al. |
| 10,151,937 B2 | 12/2018 | Lewis |
| 10,185,147 B2 | 1/2019 | Lewis |
| 10,218,679 B1 | 2/2019 | Jawahar |
| 10,241,545 B1 | 3/2019 | Richards et al. |
| 10,317,680 B1 | 6/2019 | Richards et al. |
| 10,436,594 B2 | 10/2019 | Belt et al. |
| 10,516,853 B1 | 12/2019 | Gibson et al. |
| 10,551,879 B1 | 2/2020 | Richards et al. |
| 10,578,870 B2 | 3/2020 | Kimmel |
| 10,698,202 B2 | 6/2020 | Kimmel et al. |
| 10,856,107 B2 | 10/2020 | Mycek et al. |
| 10,825,424 B2 | 11/2020 | Zhang |
| 10,987,176 B2 | 4/2021 | Poltaretskyi et al. |
| 11,190,681 B1 | 11/2021 | Brook et al. |
| 11,209,656 B1 | 12/2021 | Choi et al. |
| 11,236,993 B1 | 2/2022 | Hall et al. |
| 2001/0010598 A1 | 8/2001 | Aritake et al. |
| 2001/0018667 A1 | 8/2001 | Kim |
| 2002/0007463 A1 | 1/2002 | Fung |
| 2002/0108064 A1 | 2/2002 | Nunally |
| 2002/0063913 A1 | 5/2002 | Nakamura et al. |
| 2002/0071050 A1 | 6/2002 | Homberg |
| 2002/0095463 A1 | 7/2002 | Matsuda |
| 2002/0113820 A1 | 8/2002 | Robinson et al. |
| 2002/0122648 A1 | 9/2002 | Mule' et al. |
| 2002/0140848 A1 | 10/2002 | Cooper et al. |
| 2003/0028816 A1 | 2/2003 | Bacon |
| 2003/0048456 A1 | 3/2003 | Hill |
| 2003/0067685 A1 | 4/2003 | Niv |
| 2003/0077458 A1 | 4/2003 | Korenaga et al. |
| 2003/0080976 A1 | 5/2003 | Satoh et al. |
| 2003/0115494 A1 | 6/2003 | Cervantes |
| 2003/0218614 A1 | 11/2003 | Lavelle et al. |
| 2003/0219992 A1 | 11/2003 | Schaper |

(56) References Cited

U.S. PATENT DOCUMENTS

| | | |
|---|---|---|
| 2003/0226047 A1 | 12/2003 | Park |
| 2004/0001533 A1 | 1/2004 | Tran et al. |
| 2004/0021600 A1 | 2/2004 | Wittenberg |
| 2004/0025069 A1 | 2/2004 | Gary et al. |
| 2004/0042377 A1 | 3/2004 | Nikoloai et al. |
| 2004/0073822 A1 | 4/2004 | Greco |
| 2004/0073825 A1 | 4/2004 | Itoh |
| 2004/0111248 A1 | 6/2004 | Granny et al. |
| 2004/0113887 A1 | 6/2004 | Pair et al. |
| 2004/0174496 A1 | 9/2004 | Ji et al. |
| 2004/0186902 A1 | 9/2004 | Stewart |
| 2004/0193441 A1 | 9/2004 | Altieri |
| 2004/0201857 A1 | 10/2004 | Foxlin |
| 2004/0238732 A1 | 12/2004 | State et al. |
| 2004/0240072 A1 | 12/2004 | Schindler et al. |
| 2004/0246391 A1 | 12/2004 | Travis |
| 2004/0268159 A1 | 12/2004 | Aasheim et al. |
| 2005/0001977 A1 | 1/2005 | Zelman |
| 2005/0034002 A1 | 2/2005 | Flautner |
| 2005/0093719 A1 | 5/2005 | Okamoto et al. |
| 2005/0128212 A1 | 6/2005 | Edecker et al. |
| 2005/0157159 A1 | 7/2005 | Komiya et al. |
| 2005/0177385 A1 | 8/2005 | Hull |
| 2005/0231599 A1 | 10/2005 | Yamasaki |
| 2005/0273792 A1 | 12/2005 | Inohara et al. |
| 2006/0013435 A1 | 1/2006 | Rhoads |
| 2006/0015821 A1 | 1/2006 | Jacques Parker et al. |
| 2006/0019723 A1 | 1/2006 | Vorenkamp |
| 2006/0038880 A1 | 2/2006 | Starkweather et al. |
| 2006/0050224 A1 | 3/2006 | Smith |
| 2006/0090092 A1 | 4/2006 | Verhulst |
| 2006/0126181 A1 | 6/2006 | Levola |
| 2006/0129852 A1 | 6/2006 | Bonola |
| 2006/0132914 A1 | 6/2006 | Weiss et al. |
| 2006/0179329 A1 | 8/2006 | Terechko |
| 2006/0221448 A1 | 10/2006 | Nivon et al. |
| 2006/0228073 A1 | 10/2006 | Mukawa et al. |
| 2006/0250322 A1 | 11/2006 | Hall et al. |
| 2006/0259621 A1 | 11/2006 | Ranganathan |
| 2006/0268220 A1 | 11/2006 | Hogan |
| 2007/0058248 A1 | 3/2007 | Nguyen et al. |
| 2007/0103836 A1 | 5/2007 | Oh |
| 2007/0124730 A1 | 5/2007 | Pytel |
| 2007/0159673 A1 | 7/2007 | Freeman et al. |
| 2007/0185398 A1 | 8/2007 | Kimura et al. |
| 2007/0188837 A1 | 8/2007 | Shimizu et al. |
| 2007/0198886 A1 | 8/2007 | Saito |
| 2007/0204672 A1 | 9/2007 | Huang et al. |
| 2007/0213952 A1 | 9/2007 | Cirelli |
| 2007/0283247 A1 | 12/2007 | Brenneman et al. |
| 2008/0002259 A1 | 1/2008 | Ishizawa et al. |
| 2008/0002260 A1 | 1/2008 | Arrouy et al. |
| 2008/0030429 A1 | 2/2008 | Hailpern |
| 2008/0043334 A1 | 2/2008 | Itzkovitch et al. |
| 2008/0046773 A1 | 2/2008 | Ham |
| 2008/0063802 A1 | 3/2008 | Maula et al. |
| 2008/0068557 A1 | 3/2008 | Menduni et al. |
| 2008/0125218 A1 | 5/2008 | Collins |
| 2008/0146942 A1 | 6/2008 | Dala-Krishna |
| 2008/0173036 A1 | 7/2008 | Williams |
| 2008/0177506 A1 | 7/2008 | Kim |
| 2008/0183190 A1 | 7/2008 | Adcox et al. |
| 2008/0205838 A1 | 8/2008 | Crippa et al. |
| 2008/0215907 A1 | 9/2008 | Wilson |
| 2008/0225393 A1 | 9/2008 | Rinko |
| 2008/0235570 A1 | 9/2008 | Sawada et al. |
| 2008/0246693 A1 | 10/2008 | Hailpern et al. |
| 2008/0316768 A1 | 12/2008 | Travis |
| 2009/0076791 A1 | 3/2009 | Rhoades et al. |
| 2009/0091583 A1 | 4/2009 | McCoy |
| 2009/0153797 A1 | 6/2009 | Allon et al. |
| 2009/0177445 A1 | 7/2009 | Capps, Jr. et al. |
| 2009/0224416 A1 | 9/2009 | Laakkonen et al. |
| 2009/0245730 A1 | 10/2009 | Kleemann |
| 2009/0287728 A1 | 11/2009 | Martine et al. |
| 2009/0300528 A1 | 12/2009 | Stambaugh |
| 2009/0310633 A1 | 12/2009 | Ikegami |
| 2010/0005326 A1 | 1/2010 | Archer |
| 2010/0019962 A1 | 1/2010 | Fujita |
| 2010/0056274 A1 | 3/2010 | Uusitalo et al. |
| 2010/0060970 A1 | 3/2010 | Harris et al. |
| 2010/0063854 A1 | 3/2010 | Purvis et al. |
| 2010/0070378 A1 | 3/2010 | Trotman et al. |
| 2010/0079841 A1 | 4/2010 | Levola |
| 2010/0115428 A1 | 5/2010 | Shuping et al. |
| 2010/0153934 A1 | 6/2010 | Lachner |
| 2010/0194632 A1 | 8/2010 | Raento et al. |
| 2010/0205541 A1 | 8/2010 | Rappaport et al. |
| 2010/0214284 A1 | 8/2010 | Rieffel et al. |
| 2010/0232016 A1 | 9/2010 | Landa et al. |
| 2010/0232031 A1 | 9/2010 | Batchko et al. |
| 2010/0244168 A1 | 9/2010 | Shiozawa et al. |
| 2010/0274567 A1 | 10/2010 | Carlson et al. |
| 2010/0274627 A1 | 10/2010 | Carlson |
| 2010/0277803 A1 | 11/2010 | Pockett et al. |
| 2010/0284085 A1 | 11/2010 | Laakkonen |
| 2010/0287485 A1 | 11/2010 | Bertolami et al. |
| 2010/0296163 A1 | 11/2010 | Sarikko |
| 2010/0306715 A1 | 12/2010 | Geisner et al. |
| 2010/0309687 A1 | 12/2010 | Sampsell et al. |
| 2011/0010636 A1 | 1/2011 | Hamilton, II et al. |
| 2011/0021263 A1 | 1/2011 | Anderson et al. |
| 2011/0022870 A1 | 1/2011 | Mcgrane |
| 2011/0041083 A1 | 2/2011 | Gabai et al. |
| 2011/0050640 A1 | 3/2011 | Lundback et al. |
| 2011/0050655 A1 | 3/2011 | Mukawa |
| 2011/0064268 A1 | 3/2011 | Cobb et al. |
| 2011/0122240 A1 | 5/2011 | Becker |
| 2011/0145617 A1 | 6/2011 | Thomson et al. |
| 2011/0170801 A1 | 7/2011 | Lu et al. |
| 2011/0218733 A1 | 9/2011 | Hamza et al. |
| 2011/0286735 A1 | 11/2011 | Temblay |
| 2011/0291969 A1 | 12/2011 | Rashid et al. |
| 2012/0011389 A1 | 1/2012 | Driesen |
| 2012/0050535 A1 | 3/2012 | Densham et al. |
| 2012/0075501 A1 | 3/2012 | Oyagi et al. |
| 2012/0079466 A1 | 3/2012 | Gonion |
| 2012/0081392 A1 | 4/2012 | Arthur |
| 2012/0089854 A1 | 4/2012 | Breakstone |
| 2012/0113235 A1 | 5/2012 | Shintani |
| 2012/0127062 A1 | 5/2012 | Bar-Zeev et al. |
| 2012/0154557 A1 | 6/2012 | Perez et al. |
| 2012/0215094 A1 | 8/2012 | Rahimian et al. |
| 2012/0218301 A1 | 8/2012 | Miller |
| 2012/0246506 A1 | 9/2012 | Knight |
| 2012/0249416 A1 | 10/2012 | Maciocci et al. |
| 2012/0249741 A1 | 10/2012 | Maciocci et al. |
| 2012/0260083 A1 | 10/2012 | Andrews |
| 2012/0307075 A1 | 12/2012 | Margalitq |
| 2012/0307362 A1 | 12/2012 | Silverstein et al. |
| 2012/0314959 A1 | 12/2012 | White et al. |
| 2012/0320460 A1 | 12/2012 | Levola |
| 2012/0326948 A1 | 12/2012 | Crocco et al. |
| 2013/0021486 A1 | 1/2013 | Richardon |
| 2013/0050258 A1 | 2/2013 | Liu et al. |
| 2013/0050642 A1 | 2/2013 | Lewis et al. |
| 2013/0050833 A1 | 2/2013 | Lewis et al. |
| 2013/0051730 A1 | 2/2013 | Travers et al. |
| 2013/0061240 A1 | 3/2013 | Yan et al. |
| 2013/0077049 A1 | 3/2013 | Bohn |
| 2013/0077170 A1 | 3/2013 | Ukuda |
| 2013/0094148 A1 | 4/2013 | Sloane |
| 2013/0129282 A1 | 5/2013 | Li |
| 2013/0162940 A1 | 6/2013 | Kurtin et al. |
| 2013/0169923 A1 | 7/2013 | Schnoll et al. |
| 2013/0205126 A1 | 8/2013 | Kruglick |
| 2013/0222386 A1 | 8/2013 | Tannhauser et al. |
| 2013/0268257 A1 | 10/2013 | Hu |
| 2013/0278633 A1 | 10/2013 | Ahn et al. |
| 2013/0314789 A1 | 11/2013 | Saarikko et al. |
| 2013/0318276 A1 | 11/2013 | Dalal |
| 2013/0336138 A1 | 12/2013 | Venkatraman et al. |
| 2013/0342564 A1 | 12/2013 | Kinnebrew et al. |
| 2013/0342570 A1 | 12/2013 | Kinnebrew et al. |

(56) References Cited

U.S. PATENT DOCUMENTS

| | | |
|---|---|---|
| 2013/0342571 A1 | 12/2013 | Kinnebrew et al. |
| 2013/0343408 A1 | 12/2013 | Cook |
| 2014/0002329 A1 | 1/2014 | Nishimaki et al. |
| 2014/0013098 A1 | 1/2014 | Yeung |
| 2014/0016821 A1 | 1/2014 | Arth et al. |
| 2014/0022819 A1 | 1/2014 | Oh et al. |
| 2014/0078023 A1 | 3/2014 | Ikeda et al. |
| 2014/0082526 A1 | 3/2014 | Park et al. |
| 2014/0119598 A1 | 5/2014 | Ramachandran et al. |
| 2014/0123015 A1 | 5/2014 | Sako et al. |
| 2014/0126769 A1 | 5/2014 | Reitmayr et al. |
| 2014/0140653 A1 | 5/2014 | Brown et al. |
| 2014/0149573 A1 | 5/2014 | Tofighbakhsh et al. |
| 2014/0168260 A1 | 6/2014 | O'Brien et al. |
| 2014/0204438 A1 | 7/2014 | Yamada et al. |
| 2014/0244983 A1 | 8/2014 | McDonald et al. |
| 2014/0266987 A1 | 9/2014 | Magyari |
| 2014/0267419 A1 | 9/2014 | Ballard et al. |
| 2014/0274391 A1 | 9/2014 | Stafford |
| 2014/0282105 A1 | 9/2014 | Nordstrom |
| 2014/0292645 A1 | 10/2014 | Tsurumi et al. |
| 2014/0313228 A1 | 10/2014 | Kasahara |
| 2014/0340498 A1 | 11/2014 | Plagemann et al. |
| 2014/0359589 A1 | 12/2014 | Kodsky et al. |
| 2014/0375680 A1 | 12/2014 | Ackerman et al. |
| 2015/0005785 A1 | 1/2015 | Olson |
| 2015/0009099 A1 | 1/2015 | Queen |
| 2015/0077312 A1 | 3/2015 | Wang |
| 2015/0097719 A1 | 4/2015 | Balachandreswaran et al. |
| 2015/0123966 A1 | 5/2015 | Newman |
| 2015/0130790 A1 | 5/2015 | Vazquez, II et al. |
| 2015/0134995 A1 | 5/2015 | Park et al. |
| 2015/0138248 A1 | 5/2015 | Schrader |
| 2015/0155939 A1 | 6/2015 | Oshima et al. |
| 2015/0168221 A1 | 6/2015 | Mao et al. |
| 2015/0205126 A1 | 7/2015 | Schowengerdt |
| 2015/0235427 A1 | 8/2015 | Nobori et al. |
| 2015/0235431 A1 | 8/2015 | Schowengerdt |
| 2015/0253651 A1 | 9/2015 | Russell et al. |
| 2015/0256484 A1 | 9/2015 | Cameron |
| 2015/0269784 A1 | 9/2015 | Miyawaki et al. |
| 2015/0294483 A1 | 10/2015 | Wells et al. |
| 2015/0301955 A1 | 10/2015 | Yakovenko et al. |
| 2015/0310657 A1 | 10/2015 | Eden |
| 2015/0338915 A1 | 11/2015 | Publicover et al. |
| 2015/0355481 A1 | 12/2015 | Hilkes et al. |
| 2016/0004102 A1 | 1/2016 | Nisper et al. |
| 2016/0015470 A1 | 1/2016 | Border |
| 2016/0027215 A1 | 1/2016 | Burns et al. |
| 2016/0033770 A1 | 2/2016 | Fujimaki et al. |
| 2016/0051217 A1 | 2/2016 | Douglas et al. |
| 2016/0077338 A1 | 3/2016 | Robbins et al. |
| 2016/0085285 A1 | 3/2016 | Mangione-Smith |
| 2016/0085300 A1 | 3/2016 | Robbins et al. |
| 2016/0091720 A1 | 3/2016 | Stafford et al. |
| 2016/0093099 A1 | 3/2016 | Bridges |
| 2016/0093269 A1 | 3/2016 | Buckley et al. |
| 2016/0103326 A1 | 4/2016 | Kimura et al. |
| 2016/0123745 A1 | 5/2016 | Cotier et al. |
| 2016/0139402 A1 | 5/2016 | Lapstun |
| 2016/0139411 A1 | 5/2016 | Kang et al. |
| 2016/0155273 A1 | 6/2016 | Lyren et al. |
| 2016/0163063 A1 | 6/2016 | Ashman |
| 2016/0180596 A1 | 6/2016 | Gonzalez del Rosario |
| 2016/0187654 A1 | 6/2016 | Border et al. |
| 2016/0191887 A1 | 6/2016 | Casas |
| 2016/0202496 A1 | 7/2016 | Billetz et al. |
| 2016/0217624 A1 | 7/2016 | Finn et al. |
| 2016/0266412 A1 | 9/2016 | Yoshida |
| 2016/0267708 A1 | 9/2016 | Nistico et al. |
| 2016/0274733 A1 | 9/2016 | Hasegawa et al. |
| 2016/0287337 A1 | 10/2016 | Aram et al. |
| 2016/0300388 A1 | 10/2016 | Stafford et al. |
| 2016/0321551 A1 | 11/2016 | Priness et al. |
| 2016/0327798 A1 | 11/2016 | Xiao et al. |
| 2016/0334279 A1 | 11/2016 | Mittleman et al. |
| 2016/0357255 A1 | 12/2016 | Lindh et al. |
| 2016/0370404 A1 | 12/2016 | Quadrat et al. |
| 2016/0370510 A1 | 12/2016 | Thomas |
| 2017/0038607 A1 | 2/2017 | Camara |
| 2017/0060225 A1 | 3/2017 | Zha et al. |
| 2017/0061696 A1 | 3/2017 | Li et al. |
| 2017/0064066 A1 | 3/2017 | Das et al. |
| 2017/0100664 A1 | 4/2017 | Osterhout et al. |
| 2017/0102544 A1 | 4/2017 | Vallius et al. |
| 2017/0115487 A1 | 4/2017 | Travis |
| 2017/0122725 A1 | 5/2017 | Yeoh et al. |
| 2017/0123526 A1 | 5/2017 | Trail et al. |
| 2017/0127295 A1 | 5/2017 | Black et al. |
| 2017/0131569 A1 | 5/2017 | Aschwanden et al. |
| 2017/0147066 A1 | 5/2017 | Katz et al. |
| 2017/0160518 A1 | 6/2017 | Lanman et al. |
| 2017/0161951 A1 | 6/2017 | Fix et al. |
| 2017/0172409 A1 | 6/2017 | Cavin et al. |
| 2017/0185261 A1 | 6/2017 | Perez et al. |
| 2017/0192239 A1 | 7/2017 | Nakamura et al. |
| 2017/0201709 A1 | 7/2017 | Igarashi et al. |
| 2017/0205903 A1 | 7/2017 | Miller et al. |
| 2017/0206668 A1 | 7/2017 | Poulos et al. |
| 2017/0213388 A1 | 7/2017 | Margolis et al. |
| 2017/0214907 A1 | 7/2017 | Lapstun |
| 2017/0219841 A1 | 8/2017 | Popovich et al. |
| 2017/0232345 A1 | 8/2017 | Rofougaran et al. |
| 2017/0235126 A1 | 8/2017 | DiDomenico |
| 2017/0235129 A1 | 8/2017 | Kamakura |
| 2017/0235142 A1 | 8/2017 | Wall et al. |
| 2017/0235144 A1 | 8/2017 | Piskunov et al. |
| 2017/0235147 A1 | 8/2017 | Kamakura |
| 2017/0243403 A1 | 8/2017 | Daniels et al. |
| 2017/0246070 A1 | 8/2017 | Osterhout et al. |
| 2017/0254832 A1 | 9/2017 | Ho et al. |
| 2017/0256096 A1 | 9/2017 | Faaborg et al. |
| 2017/0258526 A1 | 9/2017 | Lang |
| 2017/0266529 A1 | 9/2017 | Reikmoto |
| 2017/0270712 A1 | 9/2017 | Tyson et al. |
| 2017/0281054 A1 | 10/2017 | Stever et al. |
| 2017/0287376 A1 | 10/2017 | Bakar et al. |
| 2017/0293141 A1 | 10/2017 | Schowengerdt et al. |
| 2017/0307886 A1 | 10/2017 | Stenberg et al. |
| 2017/0307891 A1 | 10/2017 | Bucknor et al. |
| 2017/0312032 A1 | 11/2017 | Amanatullah et al. |
| 2017/0322418 A1 | 11/2017 | Liu et al. |
| 2017/0322426 A1 | 11/2017 | Tervo |
| 2017/0329137 A1 | 11/2017 | Tervo |
| 2017/0332098 A1 | 11/2017 | Rusanovskyy et al. |
| 2017/0336636 A1 | 11/2017 | Amitai et al. |
| 2017/0336867 A1 | 11/2017 | Wilairat et al. |
| 2017/0357332 A1 | 12/2017 | Balan et al. |
| 2017/0363871 A1 | 12/2017 | Vallius |
| 2017/0371394 A1 | 12/2017 | Chan |
| 2017/0371661 A1 | 12/2017 | Sparling |
| 2018/0014266 A1 | 1/2018 | Chen |
| 2018/0024289 A1 | 1/2018 | Fattal |
| 2018/0039673 A1 | 2/2018 | Chen et al. |
| 2018/0044173 A1* | 2/2018 | Netzer ............... G01C 19/5769 |
| 2018/0052007 A1 | 2/2018 | Teskey et al. |
| 2018/0052501 A1 | 2/2018 | Jones, Jr. et al. |
| 2018/0056305 A1 | 3/2018 | Sankey et al. |
| 2018/0059305 A1 | 3/2018 | Popovich et al. |
| 2018/0067779 A1 | 3/2018 | Pillalamarri et al. |
| 2018/0070855 A1 | 3/2018 | Eichler |
| 2018/0082480 A1 | 3/2018 | White et al. |
| 2018/0084245 A1 | 3/2018 | Lapstun |
| 2018/0088185 A1 | 3/2018 | Woods et al. |
| 2018/0101214 A1 | 4/2018 | Mahindru et al. |
| 2018/0102981 A1 | 4/2018 | Kurtzman et al. |
| 2018/0108179 A1 | 4/2018 | Tomlin et al. |
| 2018/0114298 A1 | 4/2018 | Malaika et al. |
| 2018/0129112 A1 | 5/2018 | Osterhout |
| 2018/0131907 A1 | 5/2018 | Schmirler et al. |
| 2018/0136466 A1 | 5/2018 | Ko |
| 2018/0144691 A1 | 5/2018 | Choi et al. |
| 2018/0150971 A1 | 5/2018 | Adachi et al. |
| 2018/0151796 A1 | 5/2018 | Akahane |

(56) References Cited

U.S. PATENT DOCUMENTS

| | | |
|---|---|---|
| 2018/0172995 A1 | 6/2018 | Lee et al. |
| 2018/0188115 A1 | 7/2018 | Hsu et al. |
| 2018/0189568 A1 | 7/2018 | Powderly et al. |
| 2018/0190017 A1 | 7/2018 | Mendez et al. |
| 2018/0191990 A1 | 7/2018 | Motoyama et al. |
| 2018/0196084 A1* | 7/2018 | Tustaniwskyj ..... G01R 31/2874 |
| 2018/0217395 A1 | 8/2018 | Lin et al. |
| 2018/0218545 A1 | 8/2018 | Garcia et al. |
| 2018/0250589 A1 | 9/2018 | Cossairt et al. |
| 2018/0260218 A1 | 9/2018 | Gopal |
| 2018/0284877 A1 | 10/2018 | Klein |
| 2018/0292654 A1 | 10/2018 | Wall et al. |
| 2018/0299678 A1 | 10/2018 | Singer et al. |
| 2018/0357472 A1 | 12/2018 | Dreessen |
| 2019/0005069 A1 | 1/2019 | Filgueiras de Araujo et al. |
| 2019/0011691 A1 | 1/2019 | Peyman |
| 2019/0056591 A1 | 2/2019 | Tervo et al. |
| 2019/0087015 A1 | 3/2019 | Lam et al. |
| 2019/0101758 A1 | 4/2019 | Zhu et al. |
| 2019/0107723 A1 | 4/2019 | Lee et al. |
| 2019/0137788 A1 | 5/2019 | Suen |
| 2019/0155034 A1 | 5/2019 | Singer et al. |
| 2019/0155439 A1 | 5/2019 | Mukherjee et al. |
| 2019/0158926 A1 | 5/2019 | Kang et al. |
| 2019/0162950 A1 | 5/2019 | Lapstun |
| 2019/0167095 A1 | 6/2019 | Krueger |
| 2019/0172216 A1 | 6/2019 | Ninan et al. |
| 2019/0178654 A1 | 6/2019 | Hare |
| 2019/0179654 A1 | 6/2019 | Hare |
| 2019/0182415 A1 | 6/2019 | Sivan |
| 2019/0196690 A1 | 6/2019 | Chong et al. |
| 2019/0206116 A1 | 7/2019 | Xu et al. |
| 2019/0219815 A1 | 7/2019 | Price et al. |
| 2019/0243123 A1 | 8/2019 | Bohn |
| 2019/0287270 A1 | 9/2019 | Nakamura et al. |
| 2019/0318502 A1 | 10/2019 | He et al. |
| 2019/0318540 A1 | 10/2019 | Piemonte et al. |
| 2019/0321728 A1 | 10/2019 | Imai et al. |
| 2019/0347853 A1 | 11/2019 | Chen et al. |
| 2019/0380792 A1 | 12/2019 | Poltaretskyi et al. |
| 2019/0388182 A1 | 12/2019 | Kumar et al. |
| 2020/0066045 A1 | 2/2020 | Stahl et al. |
| 2020/0098188 A1 | 3/2020 | Bar-Zeev et al. |
| 2020/0100057 A1 | 3/2020 | Galon et al. |
| 2020/0110928 A1 | 4/2020 | Al Jazaery et al. |
| 2020/0117267 A1 | 4/2020 | Gibson et al. |
| 2020/0117270 A1 | 4/2020 | Gibson et al. |
| 2020/0184217 A1 | 6/2020 | Faulkner |
| 2020/0184653 A1 | 6/2020 | Faulker |
| 2020/0202759 A1 | 6/2020 | Ukai et al. |
| 2020/0242848 A1 | 7/2020 | Ambler et al. |
| 2020/0309944 A1 | 10/2020 | Thoresen et al. |
| 2020/0356161 A1 | 11/2020 | Wagner |
| 2020/0368616 A1 | 11/2020 | Delamont |
| 2020/0391115 A1 | 12/2020 | Leeper et al. |
| 2020/0409528 A1 | 12/2020 | Lee |
| 2021/0008413 A1 | 1/2021 | Asikainen et al. |
| 2021/0033871 A1 | 2/2021 | Jacoby et al. |
| 2021/0041951 A1 | 2/2021 | Gibson et al. |
| 2021/0053820 A1 | 2/2021 | Gurin et al. |
| 2021/0093391 A1 | 4/2021 | Poltaretskyi et al. |
| 2021/0093410 A1 | 4/2021 | Gaborit et al. |
| 2021/0093414 A1 | 4/2021 | Moore et al. |
| 2021/0097886 A1 | 4/2021 | Kuester et al. |
| 2021/0124901 A1 | 4/2021 | Liu et al. |
| 2021/0132380 A1 | 5/2021 | Wieczorek |
| 2021/0141225 A1 | 5/2021 | Meynen et al. |
| 2021/0142582 A1 | 5/2021 | Jones et al. |
| 2021/0158023 A1 | 5/2021 | Fu et al. |
| 2021/0158627 A1 | 5/2021 | Cossairt et al. |
| 2021/0173480 A1 | 6/2021 | Osterhout et al. |
| 2022/0366598 A1 | 11/2022 | Azimi et al. |

FOREIGN PATENT DOCUMENTS

| | | |
|---|---|---|
| CN | 102448566 A | 5/2012 |
| CN | 103460255 A | 12/2013 |
| CN | 104040410 A | 9/2014 |
| CN | 104603675 A | 5/2015 |
| CN | 105938426 A | 9/2016 |
| CN | 106662754 A | 5/2017 |
| CN | 107004303 A | 8/2017 |
| CN | 107683497 A1 | 2/2018 |
| CN | 109223121 A | 1/2019 |
| CN | 105190427 B | 11/2019 |
| EP | 0504930 A1 | 3/1992 |
| EP | 0535402 A1 | 4/1993 |
| EP | 0632360 A1 | 1/1995 |
| EP | 1215522 A2 | 6/2002 |
| EP | 1494110 A2 | 1/2005 |
| EP | 1938141 A1 | 7/2008 |
| EP | 1943556 A2 | 7/2008 |
| EP | 2290428 A2 | 3/2011 |
| EP | 2350774 A1 | 8/2011 |
| EP | 1237067 B1 | 1/2016 |
| EP | 3139245 A1 | 3/2017 |
| EP | 3164776 B1 | 5/2017 |
| EP | 3236211 A1 | 10/2017 |
| EP | 2723240 B1 | 8/2018 |
| EP | 2896986 B1 | 2/2021 |
| GB | 2499635 A | 8/2013 |
| GB | 2542853 A | 4/2017 |
| IN | 938/DEL/2004 A | 6/2006 |
| JP | H03-036974 U | 4/1991 |
| JP | H10-333094 A | 12/1998 |
| JP | 2002-015222 A | 1/2002 |
| JP | 2002-529806 | 9/2002 |
| JP | 2003-029198 A | 1/2003 |
| JP | 2003-141574 A | 5/2003 |
| JP | 2003-228027 A | 8/2003 |
| JP | 2003-329873 A | 11/2003 |
| JP | 2005-151224 A | 6/2005 |
| JP | 2005-303843 A | 10/2005 |
| JP | 2007-012530 A | 1/2007 |
| JP | 2007-86696 A | 4/2007 |
| JP | 2007-273733 A | 10/2007 |
| JP | 2008-257127 A | 10/2008 |
| JP | 2009-090689 A | 4/2009 |
| JP | 2009-244869 A | 10/2009 |
| JP | 2010-014443 A | 1/2010 |
| JP | 2010-139575 | 6/2010 |
| JP | 2010-146030 A | 7/2010 |
| JP | 2011-033993 A | 2/2011 |
| JP | 2011-257203 A | 12/2011 |
| JP | 2011-530131 A | 12/2011 |
| JP | 2012-015774 A | 1/2012 |
| JP | 2012-088777 A | 5/2012 |
| JP | 2012-235036 A | 11/2012 |
| JP | 2013-525872 A1 | 6/2013 |
| JP | 2013-206322 A | 10/2013 |
| JP | 2014-500522 A | 1/2014 |
| JP | 2014-90386 A | 5/2014 |
| JP | 2014-174366 A | 9/2014 |
| JP | 2014-192550 A | 10/2014 |
| JP | 2015-191032 A | 11/2015 |
| JP | 2016-502120 A | 1/2016 |
| JP | 2016-85463 A | 5/2016 |
| JP | 2016-516227 A | 6/2016 |
| JP | 2016-126134 A | 7/2016 |
| JP | 2017-015697 A | 1/2017 |
| JP | 2017-108444 A | 6/2017 |
| JP | 2017-153498 | 9/2017 |
| JP | 2017-531840 A | 10/2017 |
| JP | 2017-535825 A | 11/2017 |
| JP | 6232763 B2 | 11/2017 |
| JP | 2018-503165 A | 2/2018 |
| JP | 6333965 B2 | 5/2018 |
| JP | 2018-173739 A | 11/2018 |
| KR | 2005-0010775 A | 1/2005 |
| KR | 10-2006-0059992 A | 6/2006 |
| KR | 10-2011-0006408 | 1/2011 |
| KR | 10-1372623 B1 | 3/2014 |

(56) References Cited

FOREIGN PATENT DOCUMENTS

| | | |
|---|---|---|
| KR | 10-2017-0017243 | 2/2017 |
| TW | 201219829 A | 5/2012 |
| TW | 201803289 A | 1/2018 |
| WO | 1991/000565 A2 | 1/1991 |
| WO | 2000/030368 A1 | 6/2000 |
| WO | 2002/071315 A2 | 9/2002 |
| WO | 2004095248 A | 11/2004 |
| WO | 2006132614 A1 | 12/2006 |
| WO | 2007037089 A1 | 4/2007 |
| WO | 2007041678 A2 | 4/2007 |
| WO | 2007/085682 A1 | 8/2007 |
| WO | 2007/102144 A1 | 9/2007 |
| WO | 2008148927 A1 | 12/2008 |
| WO | 2009/101238 A1 | 8/2009 |
| WO | 2010015807 A1 | 2/2010 |
| WO | 2014203440 A1 | 12/2010 |
| WO | 2012030787 A2 | 3/2012 |
| WO | 2013/049012 A1 | 4/2013 |
| WO | 2013062701 A1 | 5/2013 |
| WO | 2013/145536 A1 | 10/2013 |
| WO | 2014033306 A1 | 3/2014 |
| WO | 2015/079610 A1 | 6/2015 |
| WO | 2015143641 A1 | 10/2015 |
| WO | 2015194597 A1 | 12/2015 |
| WO | 2016/054092 A1 | 4/2016 |
| WO | 2017004695 A1 | 1/2017 |
| WO | 2017044761 A1 | 3/2017 |
| WO | 2017049163 A1 | 3/2017 |
| WO | 2017051595 A1 | 3/2017 |
| WO | 2017120475 A1 | 7/2017 |
| WO | 2017176861 A1 | 10/2017 |
| WO | 2017203201 A1 | 11/2017 |
| WO | 2018008232 A1 | 1/2018 |
| WO | 2018/031261 A1 | 2/2018 |
| WO | 2018022523 A1 | 2/2018 |
| WO | 2018/044537 A1 | 3/2018 |
| WO | 2018039273 A1 | 3/2018 |
| WO | 2018057564 A1 | 3/2018 |
| WO | 2018085287 A1 | 5/2018 |
| WO | 2018087408 A1 | 5/2018 |
| WO | 2018097831 A1 | 5/2018 |
| WO | 2018/166921 A | 9/2018 |
| WO | 2018166921 A1 | 9/2018 |
| WO | 2018236587 A1 | 12/2018 |
| WO | 2019040493 A1 | 2/2019 |
| WO | 2019148154 A1 | 8/2019 |
| WO | 2020010226 A1 | 1/2020 |

OTHER PUBLICATIONS

"Final Office Action mailed on Mar. 10, 2023", U.S. Appl. No. 17/357,795, (15 pages).
"First Office Action mailed on Dec. 22, 2022 with English translation", Chinese Patent Application No. 201980061450.2, (11 pages).
"First Office Action mailed on Jan. 24, 2023 with English translation", Japanese Patent Application No. 2020-549034, (7 pages).
"First Office Action mailed on Jan. 30, 2023 with English translation", Chinese Patent Application No. 201980082951.9, (5 pages).
"First Office Action mailed on Mar. 6, 2023 with English translation", Korean Patent Application No. 10-2020-7019685, (7 pages).
"Non Final Office Action mailed on Feb. 3, 2023", U.S. Appl. No. 17/429,100, (16 pages).
"Non Final Office Action mailed on Feb. 3, 2023", U.S. Appl. No. 17/497,965, (32 pages).
"Non Final Office Action mailed on Mar. 1, 2023", U.S. Appl. No. 18/046,739, (34 pages).
"Extended European Search Report issued on Apr. 5, 2023", European Patent Application No. 20888716.6, (11 pages).
"First Office Action mailed Apr. 21, 2023 with English translation", Japanese Patent Application No. 2021-509779, (26 pages).
"First Office Action mailed on Apr. 13, 2023 with English Translation", Japanese Patent Application No. 2020-567766, (7 pages).
"First Office Action mailed on Mar. 27, 2023 with English translation", Japanese Patent Application No. 2020-566617, (6 pages).
"Non Final Office Action mailed on Apr. 13, 2023", U.S. Appl. No. 17/098,043, (7 pages).
"Non Final Office Action mailed on May 11, 2023", U.S. Appl. No. 17/822,279, (24 pages).
"Office Action mailed on Apr. 13, 2023 with English translation", Japanese Patent Application No. 2020-533730, (13 pages).
"Office Action mailed on Mar. 30, 2023 with English translation", Japanese Patent Application No. 2020-566620, (10 pages).
"Second Office Action mailed on May 2, 2023 with English Translation", Japanese Patent Application No. 2020-549034, (6 pages).
Li, Yujia , et al., "Graph Matching Networks for Learning the Similarity of Graph Structured Objects", arxiv.org, Cornell University Library, 201 Olin Library Cornell University Ithaca, NY 14853, XP081268608, Apr. 29, 2019.
Luo, Zixin , et al., "ContextDesc: Local Descriptor Augmentation With Cross-Modality Context", 2019 IEEE/CVF Conference on Computer Vision and Pattern Recognition (CVPR), IEEE, XP033686823, DOI: 10.1109/CVPR.2019.00263 [retrieved on Jan. 8, 2020], Jun. 15, 2019, pp. 2522-2531.
Zhang, Zen , et al., "Deep Graphical Feature Learning for the Feature Matching Problem", 2019 IEEE/CVF International Conference On Computer Vision (ICCV), IEEE, XP033723985, DOI: 10.1109/ICCV.2019.00519 [retrieved on Feb. 24, 2020], Oct. 27, 2019, pp. 5086-5095.
"Non Final Office Action mailed on Jan. 24, 2023", U.S. Appl. No. 17/497,940, (10 pages).
"ARToolKit: Hardware", https://web.archive.org/web/20051013062315/http://www.hitl.washington.edu:80/artoolkit/documentation/hardware.htm (downloaded Oct. 26, 2020), Oct. 13, 2015, (3 pages).
"Communication according to Rule 164(1) EPC mailed on Feb. 23, 2022", European Patent Application No. 20753144.3, (11 pages).
"Communication Pursuant to Article 94(3) EPC mailed on Sep. 4, 2019", European Patent Application No. 10793707.0, (4 pages).
"Communication Pursuant to Article 94(3) EPC mailed on Apr. 25, 2022", European Patent Application No. 18885707.2, (5 pages).
"Communication Pursuant to Article 94(3) EPC mailed on Jan. 4, 2022", European Patent Application No. 20154070.5, (8 pages).
"Communication Pursuant to Article 94(3) EPC mailed on May 30, 2022", European Patent Application No. 19768418.6, (6 pages).
"Communication Pursuant to Article 94(3) EPC mailed on Oct. 21, 2021", European Patent Application No. 16207441.3, (4 pages).
"Communication Pursuant to Rule 164(1) EPC mailed on Feb. 23, 2022", European Patent Application No. 20753144.3, (11 pages).
"Communication Pursuant to Rule 164(1) EPC mailed on Jul. 27, 2021", European Patent Application No. 19833664.6, (11 pages).
"European Search Report mailed on Oct. 15, 2020", European Patent Application No. 20180623.9, (10 pages).
"Extended European Search Report issued on Dec. 14, 2022", European Patent Application No. 20886547.7, (8 pages).
"Extended European Search Report issued on Jul. 20, 2022", European Patent Application No. 19885958.9, (9 pages).
"Extended European Search Report issued on May 20, 2020", European Patent Application No. 20154070.5, (7 pages).
"Extended European Search Report issued on Jan. 22, 2021", European Patent Application No. 18890390.0, (11 pages).
"Extended European Search Report issued on Nov. 3, 2020", European Patent Application No. 18885707.2, (7 pages).
"Extended European Search Report issued on Jun. 30, 2021", European Patent Application No. 19811971.1, (9 pages).
"Extended European Search Report issued on Mar. 4, 2021", European Patent Application No. 19768418.6, (9 pages).
"Extended European Search Report issued on Nov. 4, 2020", European Patent Application No. 20190980.1, (14 pages).
"Extended European Search Report issued on Aug. 24, 2022", European Patent Application No. 20846338.0, (13 pages).
"Extended European Search Report issued on Aug. 8, 2022", European Patent Application No. 19898874.3, (8 pages).
"Extended European Search Report issued on Sep. 8, 2022", European Patent Application No. 20798769.4, (13 pages).

(56) References Cited

OTHER PUBLICATIONS

"Extended European Search Report mailed on Nov. 3, 2022", European Patent Application No. 20770244.0, (23 pages).
"Extended European Search Report mailed on Jun. 12, 2017", European Patent Application No. 16207441.3, (8 pages).
"Extended European Search Report mailed on Jan. 28, 2022", European Patent Application No. 19815876.8, (9 pages).
"Extended European Search Report mailed on Jan. 4, 2022", European Patent Application No. 19815085.6, (9 pages).
"Extended European Search Report mailed on Jul. 16, 2021", European Patent Application No. 19810142.0, (14 pages).
"Extended European Search Report mailed on Jul. 30, 2021", European Patent Application No. 19839970.1, (7 pages).
"Extended European Search Report mailed on Jun. 19, 2020", European Patent Application No. 20154750.2, (10 pages).
"Extended European Search Report mailed on Mar. 22, 2022", European Patent Application No. 19843487.0, (14 pages).
"Extended European Search Report mailed on May 16, 2022", European Patent Application No. 19871001.4, (9 pages).
"Extended European Search Report mailed on May 30, 2022", European Patent Application No. 20753144.3, (10 pages).
"Extended European Search Report mailed on Oct. 27, 2021", European Patent Application No. 19833664.6, (10 pages).
"Extended European Search Report mailed on Sep. 20, 2021", European Patent Application No. 19851373.1, (8 pages).
"Extended European Search Report mailed on Sep. 28, 2021", European Patent Application No. 19845418.3, (13 pages).
"Final Office Action mailed on Aug. 10, 2020", U.S. Appl. No. 16/225,961, (13 pages).
"Final Office Action mailed on Dec. 29, 2022", U.S. Appl. No. 17/098,059, (32 pages).
"Final Office Action mailed on Dec. 4, 2019", U.S. Appl. No. 15/564,517, (15 pages).
"Final Office Action mailed on Feb. 19, 2020", U.S. Appl. No. 15/552,897, (17 pages).
"Final Office Action mailed on Feb. 23, 2022", U.S. Appl. No. 16/748,193, (23 pages).
"Final Office Action mailed on Feb. 3, 2022", U.S. Appl. No. 16/864,721, (36 pages).
"Final Office Action mailed on Jul. 13, 2022", U.S. Appl. No. 17/262,991, (18 pages).
"Final Office Action mailed on Jun. 15, 2021", U.S. Appl. No. 16/928,313, (42 pages).
"Final Office Action mailed on Mar. 1, 2021", U.S. Appl. No. 16/214,575, (29 pages).
"Final Office Action mailed on Mar. 19, 2021", U.S. Appl. No. 16/530,776, (25 pages).
"Final Office Action mailed on Nov. 24, 2020", U.S. Appl. No. 16/435,933, (44 pages).
"Final Office Action mailed on Sep. 17, 2021", U.S. Appl. No. 16/938,782, (44 pages).
"First Examination Report Mailed on Dec. 8, 2022", Australian Patent Application No. 2018392482, (3 pages).
"First Examination Report Mailed on Jul. 27, 2022", Chinese Patent Application No. 201980036675.2, (5 pages).
"First Examination Report Mailed on Jul. 28, 2022", Indian Patent Application No. 202047024232, (6 pages).
"First Examination Report Mailed on May 13, 2022", Indian Patent Application No. 202047026359, (8 pages).
"First Office Action mailed on Feb. 11, 2022 with English translation", Chinese Patent Application No. 201880089255.6, (17 pages).
"First Office Action mailed on Mar. 14, 2022 with English translation", Chinese Patent Application No. 201880079474.6, (11 pages).
"First Office Action mailed on Sep. 16, 2022 with English translation", Chinese Patent Application No. 201980063642.7, (7 pages).
"FS_XR5G: Permanent document, v0.4.0", QUALCOMM Incorporated, 3GPP TSG-SA 4 Meeting 103 retrieved from the Internet: URL:http://www.3gpp.org/ftp/Meetings%5F3GPP%5FSYNC/SA4/Docs/S4%2DI90526%2Ezip [retrieved on Apr. 12, 2019], Apr. 12, 2019, (98 pages).

"International Search Report and Written Opinion mailed on Feb. 12, 2021", International Application No. PCT/US20/60555, (25 pages).
"International Search Report and Written Opinion mailed on Mar. 12, 2020", International PCT Patent Application No. PCT/US19/67919, (14 pages).
"International Search Report and Written Opinion mailed on Aug. 15, 2019", International PCT Patent Application No. PCT/US19/33987, (20 pages).
"International Search Report and Written Opinion mailed on Jun. 15, 2020", International PCT Patent Application No. PCT/US2020/017023, (13 pages).
"International Search Report and Written Opinion mailed on Oct. 16, 2019", International PCT Patent Application No. PCT/US19/43097, (10 pages).
"International Search Report and Written Opinion mailed on Oct. 16, 2019", International PCT Patent Application No. PCT/US19/36275, (10 pages).
"International Search Report and Written Opinion mailed on Oct. 16, 2019", International PCT Patent Application No. PCT/US19/43099, (9 pages).
"International Search Report and Written Opinion mailed on Jun. 17, 2016", International PCT Patent Application No. PCT/FI2016/050172, (9 pages).
"International Search Report and Written Opinion mailed on Feb. 2, 2021", International PCT Patent Application No. PCT/US20/60550, (9 pages).
"International Search Report and Written Opinion mailed on Oct. 22, 2019", International PCT Patent Application No. PCT/US19/43751, (9 pages).
"International Search Report and Written Opinion mailed on Dec. 23, 2019", International PCT Patent Application No. PCT/US19/44953, (11 pages).
"International Search Report and Written Opinion mailed on May 23, 2019", International PCT Patent Application No. PCT/US18/66514, (17 pages).
"International Search Report and Written Opinion mailed on Sep. 26, 2019", International PCT Patent Application No. PCT/US19/40544, (12 pages).
"International Search Report and Written Opinion mailed on Aug. 27, 2019", International PCT Application No. PCT/US2019/035245, (8 pages).
"International Search Report and Written Opinion mailed on Dec. 27, 2019", International Application No. PCT/US19/47746, (16 pages).
"International Search Report and Written Opinion mailed on Dec. 3, 2020", International Patent Application No. PCT/US20/43596, (25 pages).
"International Search Report and Written Opinion mailed on Sep. 30, 2019", International Patent Application No. PCT/US19/40324, (7 pages).
"International Search Report and Written Opinion mailed on Sep. 4, 2020", International Patent Application No. PCT/US20/31036, (13 pages).
"International Search Report and Written Opinion mailed on Jun. 5, 2020", International Patent Application No. PCT/US20/19871, (9 pages).
"International Search Report and Written Opinion mailed on Aug. 8, 2019", International PCT Patent Application No. PCT/US2019/034763, (8 pages).
"International Search Report and Written Opinion mailed on Oct. 8, 2019", International PCT Patent Application No. PCT/US19/41151, (7 pages).
"International Search Report and Written Opinion mailed on Jan. 9, 2020", International Application No. PCT/US19/55185, (10 pages).
"International Search Report and Written Opinion mailed on Feb. 28, 2019", International Patent Application No. PCT/US18/64686, (8 pages).
"International Search Report and Written Opinion mailed on Feb. 7, 2020", International PCT Patent Application No. PCT/US2019/061265, (11 pages).

(56) References Cited

OTHER PUBLICATIONS

"International Search Report and Written Opinion mailed on Jun. 11, 2019", International PCT Application No. PCT/US19/22620, (7 pages).
"Invitation to Pay Additional Fees mailed Aug. 15, 2019", International PCT Patent Application No. PCT/US19/36275, (2 pages).
"Invitation to Pay Additional Fees mailed Sep. 24, 2020", International Patent Application No. PCT/US2020/043596, (3 pages).
"Invitation to Pay Additional Fees mailed on Oct. 22, 2019", International PCT Patent Application No. PCT/US19/47746, (2 pages).
"Invitation to Pay Additional Fees mailed on Apr. 3, 2020", International Patent Application No. PCT/US20/17023, (2 pages).
"Invitation to Pay Additional Fees mailed on Oct. 17, 2019", International PCT Patent Application No. PCT/US19/44953, (2 pages).
"Multi-core processor", TechTarget, 2013, (1 page).
"Non Final Office Action mailed on Apr. 1, 2022", U.S. Appl. No. 17/256,961, (65 pages).
"Non Final Office Action mailed on Apr. 11, 2022", U.S. Appl. No. 16/938,782, (52 pages).
"Non Final Office Action mailed on Apr. 12, 2022", U.S. Appl. No. 17/262,991, (60 pages).
"Non Final Office Action mailed on Aug. 21, 2019", U.S. Appl. No. 15/564,517, (14 pages).
"Non Final Office Action mailed on Aug. 4, 2021", U.S. Appl. No. 16/864,721, (21 pages).
"Non Final Office Action mailed on Dec. 7, 2022", U.S. Appl. No. 17/357,795, (63 pages).
"Non Final Office Action mailed on Feb. 2, 2022", U.S. Appl. No. 16/783,866, (8 pages).
"Non Final Office Action mailed on Jan. 26, 2021", U.S. Appl. No. 16/928,313, (33 pages).
"Non Final Office Action mailed on Jan. 27, 2021", U.S. Appl. No. 16/225,961, (15 pages).
"Non Final Office Action mailed on Jul. 26, 2022", U.S. Appl. No. 17/098,059, (28 pages).
"Non Final Office Action mailed on Jul. 27, 2020", U.S. Appl. No. 16/435,933, (16 pages).
"Non Final Office Action mailed on Jul. 9, 2021", U.S. Appl. No. 17/002,663, (43 pages).
"Non Final Office Action mailed on Jul. 9, 2021", U.S. Appl. No. 16/833,093, (47 pages).
"Non Final Office Action mailed on Jun. 10, 2021", U.S. Appl. No. 16/938,782, (40 Pages).
"Non Final Office Action mailed on Jun. 17, 2020", U.S. Appl. No. 16/682,911, (22 pages).
"Non Final Office Action mailed on Jun. 19, 2020", U.S. Appl. No. 16/225,961, (35 pages).
"Non Final Office Action mailed on Jun. 29, 2021", U.S. Appl. No. 16/698,588, (58 pages).
"Non Final Office Action mailed on Mar. 3, 2021", U.S. Appl. No. 16/427,337, (41 pages).
"Non Final Office Action mailed on Mar. 31, 2022", U.S. Appl. No. 17/257,814, (60 pages).
"Non Final Office Action mailed on Mar. 9, 2022", U.S. Appl. No. 16/870,676, (57 pages).
"Non Final Office Action mailed on May 10, 2022", U.S. Appl. No. 17/140,921, (25 pages).
"Non Final Office Action mailed on May 17, 2022", U.S. Appl. No. 16/748,193, (11 pages).
"Non Final Office Action mailed on May 26, 2021", U.S. Appl. No. 16/214,575, (19 pages).
"Non Final Office Action mailed on Nov. 19, 2019", U.S. Appl. No. 16/355,611, (31 pages).
"Non Final Office Action mailed on Nov. 5, 2020", U.S. Appl. No. 16/530,776, (45 pages).
"Non Final Office Action mailed on Oct. 22, 2019", U.S. Appl. No. 15/859,277, (15 pages).
"Non Final Office Action mailed on Sep. 1, 2020", U.S. Appl. No. 16/214,575, (40 pages).
"Non Final Office Action mailed on Sep. 19, 2022", U.S. Appl. No. 17/263,001, (14 pages).
"Non Final Office Action mailed on Sep. 20, 2021", U.S. Appl. No. 17/105,848, (56 pages).
"Non Final Office Action mailed on Sep. 29, 2021", U.S. Appl. No. 16/748,193, (62 pages).
"Notice of Allowance mailed on Mar. 25, 2020", U.S. Appl. No. 15/564,517, (11 pages).
"Notice of Allowance mailed on Oct. 5, 2020", U.S. Appl. No. 16/682,911, (27 pages).
"Notice of Reason for Rejection mailed on Oct. 28, 2022 with English translation", Japanese Patent Application No. 2020-531452, (3 pages).
"Notice of Reason of Refusal mailed on Sep. 11, 2020 with English translation", Japanese Patent Application No. 2019-140435, (6 pages).
"Office Action mailed on Nov. 24, 2022 with English Translation", Japanese Patent Application No. 2020-533730, (11 pages).
"Phototourism Challenge", CVPR 2019 Image Matching Workshop. https://image matching-workshop. github.io., (16 pages).
"Second Office Action mailed on Jul. 13, 2022 with English Translation", Chinese Patent Application No. 201880079474.6, (10 pages).
"Second Office Action mailed on Jun. 20, 2022 with English Translation", Chinese Patent Application No. 201880089255.6, (14 pages).
"Summons to attend oral proceedings pursuant to Rule 115(1) EPC mailed on Jul. 15, 2019", European Patent Application No. 15162521. 7, (7 pages).
Aarik, J., et al., "Effect of crystal structure on optical properties of TiO2 films grown by atomic layer deposition", Thin Solid Films; Publication [online]. May 19, 1998 [retrieved Feb. 19, 2020]. Retrieved from the Internet: <URL: https://www.sciencedirect.com/science/article/pii/S0040609097001351?via%3Dihub>; DOI: 10.1016/S0040-6090(97)00135-1; see entire document, (2 pages).
Altwaijry, et al., "Learning to Detect and Match Keypoints with Deep Architectures", Proceedings of the British Machine Vision Conference (BMVC), BMVA Press, Sep. 2016, [retrieved on Jan. 8, 2021 (Jan. 8, 2021 )] < URL: http://www.bmva.org/bmvc/2016/papers/paper049/index.html >, en lire document, especially Abstract.
Anonymous, "Koi Pond: Top iPhone App Store Paid App", https://web.archive.org/web/20080904061233/https://www.iphoneincanada.ca/reviews /koi-pond-top-iphone-app-store-paid-app/—[retrieved on Aug. 9, 2022].
Arandjelović, Relja, et al., "Three things everyone should know to improve object retrieval", CVPR, 2012, (8 pages).
Azom, "Silica—Silicon Dioxide (SiO2)", AZO Materials; Publication [Online]. Dec. 13, 2001 [retrieved Feb. 19, 2020]. Retrieved from the Internet: <URL: https://www.azom.com/article.aspx?Article1D=1114>.
Azuma, Ronald T., "A Survey of Augmented Reality", Presence: Teleoperators and Virtual Environments 6, 4 (Aug. 1997), 355-385; https://web.archive.org/web/20010604100006/http://www.cs.unc.edu/~azuma/ARpresence.pdf (downloaded Oct. 26, 2020).
Azuma, Ronald T., "Predictive Tracking for Augmented Reality", Department of Computer Science, Chapel Hill NC; TR95-007, Feb. 1995, 262 pages.
Battaglia, Peter W, et al., "Relational inductive biases, deep learning, and graph networks", arXiv:1806.01261, Oct. 17, 2018, pp. 1-40.
Berg, Alexander C, et al., "Shape matching and object recognition using low distortion correspondences", In CVPR, 2005, (8 pages).
Bian, Jiawang, et al., "GMS: Grid-based motion statistics for fast, ultra-robust feature correspondence.", In CVPR (Conference on Computer Vision and Pattern Recognition), 2017, (10 pages).
Bimber, Oliver, et al., "Spatial Augmented Reality: Merging Real and Virtual Worlds", https://web.media.mit.edu/~raskar/book/BimberRaskarAugmentedRealityBook.pdf; published by A K Peters/CRC Press (Jul. 31, 2005); eBook (3rd Edition, 2007), (393 pages).

(56) References Cited

OTHER PUBLICATIONS

Brachmann, Eric, et al., "Neural-Guided RANSAC: Learning Where to Sample Model Hypotheses", In ICCV (International Conference on Computer Vision ), arXiv:1905.04132v2 [cs.CV] Jul. 31, 2019, (17 pages).
Butail, et al., "Putting the fish in the fish tank: Immersive VR for animal behavior experiments", In: 2012 IEEE International Conference on Robotics and Automation. May 18, 2012 (May 18, 2012) Retrieved on Nov. 14, 2020 (Nov. 14, 2020) from <http:/lcdcl.umd.edu/papers/icra2012.pdf> entire document.
Caetano, Tibério S, et al., "Learning graph matching", IEEE TPAMI, 31(6):1048-1058, 2009.
Cech, Jan, et al., "Efficient sequential correspondence selection by cosegmentation", IEEE TPAMI, 32(9):1568-1581, Sep. 2010.
Chittineni, C., et al., "Single filters for combined image geometric manipulation and enhancement", Proceedings of SPIE vol. 1903, Image and Video Processing, Apr. 8, 1993, San Jose, CA. (Year: 1993), pp. 111-121.
Cuturi, Marco, "Sinkhorn distances: Lightspeed computation of optimal transport", NIPS, 2013, (9 pages).
Dai, Angela, et al., "ScanNet: Richly-annotated 3d reconstructions of indoor scenes", In CVPR, arXiv:1702.04405v2 [cs.CV] Apr. 11, 2017, (22 pages).
Deng, Haowen, et al., "PPFnet: Global context aware local features for robust 3d point matching", In CVPR, arXiv:1802.02669v2 [cs.CV] Mar. 1, 2018, (12 pages).
Detone, Daniel, et al., "Deep image homography estimation", In RSS Work- shop: Limits and Potentials of Deep Learning in Robotics, arXiv:1606.03798v1 [cs.CV] Jun. 13, 2016, (6 pages).
Detone, Daniel, et al., "Self-improving visual odometry", arXiv:1812.03245, Dec. 8, 2018, (9 pages).
Detone, Daniel, et al., "SuperPoint: Self-supervised interest point detection and description", In CVPR Workshop on Deep Learning for Visual SLAM, arXiv:1712.07629v4 [cs.CV] Apr. 19, 2018, (13 pages).
Dusmanu, Mihai, et al., "D2-net: A trainable CNN for joint detection and description of local features", CVPR, arXiv:1905.03561v1 [cs.CV] May 9, 2019, (16 pages).
Ebel, Patrick, et al., "Beyond cartesian representations for local descriptors", ICCV, arXiv:1908.05547v1 [cs.CV] Aug. 15, 2019, (11 pages).
Fischler, Martin A, et al., "Random sample consensus: a paradigm for model fitting with applications to image analysis and automated cartography", Communications of the ACM, 24(6): 1981, pp. 381-395.
Gilmer, Justin, et al., "Neural message passing for quantum chemistry", In ICML, arXiv:1704.01212v2 [cs.LG] Jun. 12, 2017, (14 pages).
Giuseppe, Donato, et al., "Stereoscopic helmet mounted system for real time 3D environment reconstruction and indoor ego—motion estimation", Proc. SPIE 6955, Head- and Helmet-Mounted Displays XIII: Design and Applications, SPIE Defense and Security Symposium, 2008, Orlando, Florida, United States, 69550P.
Goodfellow, "Titanium Dioxide—Titania (TiO2)", AZO Materials; Publication [online]. Jan. 11, 2002 [retrieved Feb. 19, 2020]. Retrieved from the Internet: <URL: https://www.azom.com/article.aspx?Article1D=1179>.
Hartley, Richard, et al., "Multiple View Geometry in Computer Vision", Cambridge University Press, 2003, pp. 1-673.
Jacob, Robert J.K., "Eye Tracking in Advanced Interface Design", Human-Computer Interaction Lab, Naval Research Laboratory, Washington, D.C., date unknown. 2003, pp. 1-50.
Lee, et al., "Self-Attention Graph Pooling", Cornell University Library/Computer Science/Machine Learning, Apr. 17, 2019 [retrieved on Jan. 8, 2021 from the Internet< URL: https://arxiv.org/abs/1904.08082 >, entire document.
Lee, Juho, et al., "Set transformer: A frame-work for attention-based permutation-invariant neural networks", ICML, arXiv:1810.00825v3 [cs.LG] May 26, 2019, (17 pages).
Leordeanu, Marius, et al., "A spectral technique for correspondence problems using pairwise constraints", Proceedings of (ICCV) International Conference on Computer Vision, vol. 2, pp. 1482-1489, Oct. 2005, (8 pages).
Levola, T., "Diffractive Optics for Virtual Reality Displays", Journal of the SID Eurodisplay May 14, 2005, XP008093627, chapters 2-3, Figures 2 and 10, pp. 467-475.
Levola, Tapani, "Invited Paper: Novel Diffractive Optical Components for Near to Eye Displays—Nokia Research Center", SID 2006 DIGEST, 2006 SID International Symposium, Society for Information Display, vol. XXXVII, May 24, 2005, chapters 1-3, figures 1 and 3, pp. 64-67.
Li, Yujia, et al., "Graph matching networks for learning the similarity of graph structured objects", ICML, arXiv:1904.12787v2 [cs.LG] May 12, 2019, (18 pages).
Li, Zhengqi, et al., "Megadepth: Learning single—view depth prediction from internet photos", In CVPR, fromarXiv: 1804.00607v4 [cs.CV] Nov. 28, 2018, (10 pages).
Libovicky, et al., "Input Combination Strategies for Multi-Source Transformer Decoder", Proceedings of the Third Conference on Machine Translation (WMT). vol.1: Research Papers, Belgium, Brussels, Oct. 31-Nov. 1, 2018; retrieved on Jan. 8, 2021 (Jan. 8, 2021 ) from < URL: https://doi.org/10.18653/v1/V18-64026 >, entire document.
Loiola, Eliane Maria, et al., "A survey for the quadratic assignment problem", European journal of operational research, 176(2): 2007, pp. 657-690.
Lowe, David G, "Distinctive image features from scale—invariant keypoints", International Journal of Computer Vision, 60(2): 91-110, 2004, (28 pages).
Luo, Zixin, et al., "ContextDesc: Local descriptor augmentation with cross-modality context", CVPR, arXiv:1904.04084v1 [cs.CV] Apr. 8, 2019, (14 pages).
Memon, F., et al., "Synthesis, Characterization and Optical Constants of Silicon Oxycarbide", EPJ Web of Conferences; Publication [online]. Mar. 23, 2017 [retrieved Feb. 19, 2020) .<URL: https://www.epj-conferences.org/articles/epjconf/pdf/2017/08/epjconf_nanop2017 _00002.pdf>; DOI: 10.1051/epjconf/201713900002, (8 pages).
Molchanov, Pavlo, et al., "Short-range FMCW monopulse radar for hand-gesture sensing", 2015 IEEE Radar Conference (RadarCon) (2015), pp. 1491-1496.
Mrad, et al., "A framework for System Level Low Power Design Space Exploration", 1991.
Munkres, James, "Algorithms for the assignment and transportation problems", Journal of the Society for Industrial and Applied Mathematics, 5(1): 1957, pp. 32-38.
Ono, Yuki, et al., "LF-Net: Learning local features from images", 32nd Conference on Neural Information Processing Systems (NIPS 2018), arXiv:1805.09662v2 [cs.CV] Nov. 22, 2018, (13 pages).
Paszke, Adam, et al., "Automatic differentiation in Pytorch", 31st Conference on Neural Information Processing Systems (NIPS 2017), Long Beach, CA, USA, (4 pages).
Peyré, Gabriel, et al., "Computational Optimal Transport", Foundations and Trends in Machine Learning, 11(5-6):355-607, 2019; arXiv:1803.00567v4 [stat.ML] Mar. 18, 2020, (209 pages).
Qi, Charles Ruizhongtai, et al., "Pointnet++: Deep hierarchical feature learning on point sets in a metric space.", 31st Conference on Neural Information Processing Systems (NIPS 2017), Long Beach, CA, USA., Jun. 7, 2017, (10 pages).
Qi, Charles R, et al., "Pointnet: Deep Learning on Point Sets for 3D Classification and Segmentation", CVPR, arXiv:1612.00593v2 [cs.CV] Apr. 10, 2017, (19 pages).
Radenović, Filip, et al., "Revisiting Oxford and Paris: Large-Scale Image Retrieval Benchmarking", CVPR, arXiv:1803.11285v1 [cs.CV] Mar. 29, 2018, (10 pages).
Raguram, Rahul, et al., "A comparative analysis of ransac techniques leading to adaptive real-time random sample consensus", Computer Vision—ECCV 2008, 10th European Conference on Computer Vision, Marseille, France, Oct. 12-18, 2008, Proceedings, Part I, (15 pages).
Ranftl, René, et al., "Deep fundamental matrix estimation", European Conference on Computer Vision (ECCV), 2018, (17 pages).

(56) References Cited

OTHER PUBLICATIONS

Revaud, Jerome, et al., "R2D2: Repeatable and Reliable Detector and Descriptor", In NeurIPS, arXiv:1906.06195v2 [cs.CV] Jun. 17, 2019, (12 pages).
Rocco, Ignacio, et al., "Neighbourhood Consensus Networks", 32nd Conference on Neural Information Processing Systems (NeurIPS 2018), Montreal, Canada, arXiv:1810.10510v2 [cs.CV] Nov. 29, 2018, (20 pages).
Rublee, Ethan, et al., "ORB: An efficient alternative to SIFT or SURF", Proceedings of the IEEE International Conference on Computer Vision. 2564-2571. 2011; 10.1109/ICCV.2011.612654, (9 pages).
Sarlin, et al., "SuperGlue: Learning Feature Matching with Graph Neural Networks", Cornell University Library/Computer Science/Computer Vision and Pattern Recognition, Nov. 26, 2019 [retrieved on Jan. 8, 2021 from the Internet< URL: https://arxiv.org/abs/1911.11763 >, entire document.
Sattler, Torsten, et al., "SCRAMSAC: Improving RANSAC's efficiency with a spatial consistency filter", ICCV, 2009: 2090-2097., (8 pages).
Schonberger, Johannes Lutz, et al., "Pixelwise view selection for un-structured multi-view stereo", Computer Vision—ECCV 2016: 14th European Conference, Amsterdam, The Netherlands, Oct. 11-14, 2016, Proceedings, Part III, pp. 501-518, 2016.
Schonberger, Johannes Lutz, et al., "Structure-from-motion revisited", Proceedings of the IEEE Conference on Computer Vision and Pattern Recognition (CVPR), 2016, pp. 4104-4113, (11 pages).
Sheng, Liu, et al., "Time-multiplexed dual-focal plane head-mounted display with a liquid lens", Optics Letters, Optical Society of Amer I CA, US, vol. 34, No. 11, Jun. 1, 2009 (Jun. 1, 2009), XP001524475, ISSN: 0146-9592, pp. 1642-1644.
Sinkhorn, Richard, et al., "Concerning nonnegative matrices and doubly stochastic matrices.", Pacific Journal of Mathematics, 1967, pp. 343-348.
Spencer, T., et al., "Decomposition of poly(propylene carbonate) with UV sensitive iodonium 11 salts", Polymer Degradation and Stability; (online]. Dec. 24, 2010 (retrieved Feb. 19, 2020]., (17 pages).
Tanriverdi, Vildan, et al., "Interacting With Eye Movements in Virtual Environments", Department of Electrical Engineering and Computer Science, Tufts University; Proceedings of the SIGCHI conference on Human Factors in Computing Systems, Apr. 2000, pp. 1-8.
Thomee, Bart, et al., "YFCC100m: The new data in multimedia research", Communications of the ACM, 59(2):64-73, 2016; arXiv:1503.01817v2 [cs.MM] Apr. 25, 2016, (8 pages).
Torresani, Lorenzo, et al., "Feature correspondence via graph matching: Models and global optimization", Computer Vision—ECCV 2008, 10th European Conference on Computer Vision, Marseille, France, Oct. 12-18, 2008, Proceedings, Part II, (15 pages).
Tuytelaars, Tinne, et al., "Wide baseline stereo matching based on local, affinely invariant regions", BMVC, 2000, pp. 1-14.
Ulyanov, Dmitry, et al., "Instance normalization: The missing ingredient for fast stylization", arXiv:1607.08022v3 [cs.CV] Nov. 6, 2017, (6 pages).
Vaswani, Ashish, et al., "Attention is all you need", 31st Conference on Neural Information Processing Systems (NIPS 2017), Long Beach, CA, USA; arXiv:1706.03762v5 [cs.CL] Dec. 6, 2017, (15 pages).
Veličković, Petar, et al., "Graph attention networks", ICLR, arXiv:1710.10903v3 [stat.ML] Feb. 4, 2018, (12 pages).
Villani, Cédric, "Optimal transport: old and new", vol. 338. Springer Science & Business Media, Jun. 2008, pp. 1-998.
Wang, Xiaolong, et al., "Non-local neural networks", CVPR, arXiv:1711.07971v3 [cs.CV] Apr. 13, 2018, (10 pages).
Wang, Yue, et al., "Deep Closest Point: Learning representations for point cloud registration", ICCV, arXiv:1905.03304v1 [cs.CV] May 8, 2019, (10 pages).
Wang, Yue, et al., "Dynamic Graph CNN for learning on point clouds", ACM Transactions on Graphics, arXiv:1801.07829v2 [cs.CV] Jun. 11, 2019, (13 pages).
Weissel, et al., "Process cruise control: event-driven clock scaling for dynamic power management", Proceedings of the 2002 international conference on Compilers, architecture, and synthesis for embedded systems. Oct. 11, 2002 (Oct. 11, 2002) Retrieved on May 16, 2020 (May 16, 2020) from <URL: https://dl.acm.org/doi/pdf/10.1145/581630.581668>.
Yi, Kwang Moo, et al., "Learning to find good correspondences", CVPR, arXiv:1711.05971v2 [cs.CV] May 21, 2018, (13 pages).
Yi, Kwang Moo, et al., "Lift: Learned invariant feature transform", ECCV, arXiv:1603.09114v2 [cs.CV] Jul. 29, 2016, (16 pages).
Zaheer, Manzil, et al., "Deep Sets", 31st Conference on Neural Information Processing Systems (NIPS 2017), Long Beach, CA, USA; arXiv:1703.06114v3 [cs.LG] Apr. 14, 2018, (29 pages).
Zhang, Jiahui, et al., "Learning two-view correspondences and geometry using order-aware network", ICCV; aarXiv:1908.04964v1 [cs.CV] Aug. 14, 2019, (11 pages).
Zhang, Li, et al., "Dual graph convolutional net- work for semantic segmentation", BMVC, 2019; arXiv:1909.06121v3 [cs.CV] Aug. 26, 2020, (18 pages).
"Communication Pursuant to Article 94(3) EPC mailed on Feb. 21, 2024", European Patent Application No. 20770244.0, (8 pages).
"Communication Pursuant to Article 94(3) EPC mailed on Feb. 28, 2023", European Patent Application No. 19845418.3, (6 Pages).
"Communication Pursuant to Article 94(3) EPC mailed on Jul. 28, 2023", European Patent Application No. 19843487.0, (15 pages).
"Communication Pursuant to Article 94(3) EPC mailed on Mar. 11, 2024", European Patent Application No. 20798769.4, (12 pages).
"Communication Pursuant to Article 94(3) EPC mailed on May 23, 2023", European Patent Application No. 18890390.0, (5 pages).
"Communication Pursuant to Article 94(3) EPC mailed on Oct. 6, 2023", European Patent Application No. 19851373.1, (6 pages).
"Extended European Search Report issued on Jan. 8, 2024", European Patent Application No. 23195266.4, (8 pages).
"Extended European Search Report issued on Apr. 25, 2024", European Patent Application No. 23208907.8, (9 pages).
"Extended European Search Report issued on Jul. 9, 2024", European Patent Application No. 24166847.4, (8 pages).
"Final Office Action mailed Oct. 16, 2023", U.S. Appl. No. 17/098,043, (7 pages).
"Final Office Action mailed on Dec. 1, 2023", U.S. Appl. No. 17/357,795, (18 pages).
"Final Office Action mailed on May 24, 2024", U.S. Appl. No. 18/046,739, (52 pages).
"Final Office Action mailed on Sep. 8, 2023 with English translation", Japanese Patent Application No. 2020-566620, (18 pages).
"First Examination Report Mailed on Aug. 8, 2023", Australian Patent Application No. 2018379105, (3 pages).
"First Office Action mailed Dec. 12, 2023 with English translation", Japanese Patent Application No. 2021-545712, (8 pages).
"First Office Action mailed Dec. 20, 2023 with English translation", Chinese Patent Application No. 201980050600.X, (21 pages).
"First Office Action mailed Dec. 27, 2023 with English translation", Chinese Patent Application No. 201980075942.7, (7 pages).
"First Office Action mailed Jul. 4, 2023 with English translation", Japanese Patent Application No. 2021-505669, (6 pages).
"First Office Action mailed Jun. 20, 2024 with English translation", Japanese Patent Application No. 2021-564496, (14 pages).
"First Office Action mailed Jun. 24, 2024 with English translation", Japanese Patent Application No. 2022-504602, (7 pages).
"First Office Action mailed Mar. 1, 2024 with English translation", Japanese Patent Application No. 2021-553297, (5 pages).
"First Office Action mailed Mar. 20, 2024 with English translation", Chinese Patent Application No. 202080048293.4, (22 pages).
"First Office Action mailed Nov. 2, 2023 with English translation", Chinese Patent Application No. 201980090867.1, (16 pages).
"First Office Action mailed on Dec. 11, 2023 with translation", Chinese Patent Application No. 201980032005.3, (17 pages).
"First Office Action mailed on Dec. 25, 2023 with English translation", Chinese Patent Application No. 2019800046303.8, (13 pages).

(56) References Cited

OTHER PUBLICATIONS

"First Office Action mailed on Feb. 1, 2024 with English translation", Chinese Patent Application No. 202080018865.4, (9 pages).
"First Office Action mailed on Jun. 13, 2023 with English translation", Japanese Patent Application No. 2020-567853, (7 pages).
"First Office Action mailed on Mar. 25, 2024 with English translation", Chinese Patent Application No. 202080018919.7, (21 pages).
"First Office Action mailed on May 26, 2023 with English translation", Japanese Patent Application No. 2021-500607, (6 pages).
"First Office Action mailed on May 30, 2023 with English translation", Japanese Patent Application No. 2021-519873, (8 pages).
"First Office Action mailed Sep. 29, 2023 with English translation", Japanese Patent Application No. 2023-10887, (5 pages).
"Non Final Office Action mailed Nov. 19. 2019", U.S. Appl. No. 16/355,611, (31 pages).
"Non Final Office Action mailed on Aug. 2, 2023", U.S. Appl. No. 17/807,600, (25 pages).
"Non Final Office Action mailed on Feb. 26, 2024", U.S. Appl. No. 18/046,739, (48 pages).
"Non Final Office Action mailed on Jul. 20, 2023", U.S. Appl. No. 17/650,188, (11 pages).
"Non Final Office Action mailed on Jun. 14, 2023", U.S. Appl. No. 17/516,483, (10 pages).
"Non Final Office Action mailed on Jun. 17, 2024", U.S. Appl. No. 18/348,732, (19 pages).
"Non Final Office Action mailed on May 16, 2024", U.S. Appl. No. 18/361,546, (11 pages).
"Non Final Office Action mailed on Nov. 22, 2023", U.S. Appl. No. 17/268,376, (8 pages).
"Non Final Office Action mailed on Nov. 3, 2023", U.S. Appl. No. 17/416,248, (17 pages).
"Non Final Office Action mailed on Oct. 11, 2023", U.S. Appl. No. 17/357,795, (14 pages).
"Non Final Office Action mailed on Oct. 24, 2023", U.S. Appl. No. 17/259,020, (21 pages).
"Notice of Allowance mailed on Jul. 27, 2023 with English translation", Korean Patent Application No. 10-2020-7019685, (4 pages).
"Office Action mailed Nov. 21, 2023 with English Translation", Japanese Patent Application No. 2021-535716, (15 pages).
"Office Action mailed on Dec. 14, 2023 with English translation", Japanese Patent Application No. 2021-526564, (13 pages).
"Office Action mailed on Feb. 19, 2024 with English translation", Korean Patent Application No. 10-2020-7020552, (18 pages).
"Office Action mailed on Feb. 26, 2024 with English translation", Chinese Patent Application No. 201980069194.1, (11 pages).
"Office Action mailed on Jul. 20, 2023 with English translation", Japanese Patent Application No. 2021-505884, (6 pages).
"Office Action mailed on Jun. 8, 2023 with English translation", Japanese Patent Application No. 2021-503762, (6 pages).
"Office Action mailed on Mar. 6, 2024 with English translation", Chinese Patent Application No. 201980053016.X, (7 pages).
"Extended European Search Report issued on Aug. 6, 2024", European Patent Application No. 24184599.9, (14 pages).
"First Office Action with English translation dated Aug. 8, 2024", Chinese Patent Application No. 202080053774.4, (23 pages).
"Non Final Office Action mailed on Sep. 24, 2024", U.S. Appl. No. 18/597,716, (9 pages).
"Penultimate Office Action mailed on Sep. 17, 2024 with English translation", Japanese Patent Application No. 2023-115047, (7 pages).
"Second Office Action with English translation mailed on Jul. 2, 2024", Chinese Patent Application No. 201980032005.3, (15 pages).
"Communication Pursuant to Article 94(3) EPC mailed Nov. 28, 2024", European Patent Application No. 19885958.9, (5 pages).
"Communication Pursuant to Article 94(3) EPC mailed on Nov. 21, 2024", European Patent Application No. 20846338.0, (11 pages).
"Extended European Search Report issued on Dec. 2, 2024", European Patent Application No. 24167829.1, (7 pages).
"Final Office Action mailed on Dec. 13, 2024", Japanese Patent Application No. 2021-564496, (13 pages).
"First Office Action mailed Oct. 17, 2024 with English translation", Japanese Patent Application No. 2022-527990, (24 pages).
"Non Final Office Action mailed on Jan. 3, 2025", U.S. Appl. No. 18/746,709, (31 pages).
"Notice of Reasons for Rejection mailed on Dec. 4, 2024 with English tranlsation", Japanese Patent Application No. 2023-118968, (9 pages).
"Office Action mailed on Nov. 7, 2024 with English translation", Korean Patent Application No. 10-2024-7032937, (7 pages).

\* cited by examiner

TEMPERATURE DEPENDENT CALIBRATION OF MOVEMENT DETECTION DEVICES

CROSS-REFERENCE TO RELATED APPLICATIONS

This application is a division of U.S. patent application Ser. No. 17/262,991, filed on Jan. 25, 2021, which is a National Phase of International Application No: PCT/US2019/043099, filed on Jul. 23, 2019, which claims priority from U.S. Provisional Patent Application No. 62/702,870, filed on Jul. 24, 2018, all of which are incorporated herein by reference in their entirety.

BACKGROUND OF THE INVENTION

1). Field of the Invention

This invention relates generally to an electronics system, a method of constructing an electronics system and a method of operating an electronics device, and more specifically to calibration of movement detection devices.

2). Discussion of Related Art

Electronics devices such as semiconductor chips frequently include movement detection devices such as accelerometers and gyroscopes. An accelerometer can detect acceleration of the electronics device in a specified direction and a gyroscope can detect a change in angle of the electronics device. Such measurement devices are usually manufactured using microelectromechanical systems (MEMS) technology.

SUMMARY OF THE INVENTION

The invention provides an electronics system including a board. The board may include a structural material, a thermal conduit on the structural material, the thermal conduit having a thermal conductivity that is higher than a thermal conductivity of the structural material and having a first region, a second region, and a connecting portion connecting the first region to the second region, a thermal interface on the structural material, the thermal interface having a thermal heat transfer capacity that is higher than the thermal heat transfer capacity of the structural material and being attached to the first region of the thermal conduit and an electronics device mounted to the board at the second region of the thermal conduit, the thermal conduit forming a thermal path between the surface of the thermal interface and the electronics device.

The invention also provides a method of constructing an electronics system including constructing a board that may include forming a thermal conduit on the structural material, the thermal conduit having a thermal heat transfer capacity that is higher than a thermal heat transfer capacity of the structural material and having a first region, a second region, and a connecting portion connecting the first region to the second region, forming a thermal interface on the structural material, the thermal interface having a thermal heat transfer capacity conductivity that is higher than the thermal heat transfer capacity of the structural material and being attached to the first region of the thermal conduit and mounting an electronics device to the board at the second region of the thermal conduit, the thermal conduit forming a thermal path between the surface of the thermal interface and the electronics device.

The invention further provides a method of operating an electronics device including operating an electronics device mounted to a board, locating a thermal device adjacent a thermal interface of the board formed on a structural material of the board and transferring heat between the thermal device and the electronics device through a thermal conduit on the structural material, the thermal conduit having a thermal heat transfer capacity that is higher than a thermal heat transfer capacity of the structural material and having a first region attached to the thermal interface, a second region at the electronics device, and a connecting portion connecting the first region to the second region.

BRIEF DESCRIPTION OF THE DRAWINGS

The invention is described by way of examples with reference to the accompanying drawings, wherein.

DETAILED DESCRIPTION OF THE INVENTION

Output readings from movement detection devices, such as accelerometers and gyroscopes, can be affected by changes in temperature of the devices, thereby introducing temperature-dependent error in the output measurements. For example, an accelerometer at rest should provide an output measurement corresponding to gravitational acceleration; however when the accelerometer is subjected to different temperatures, the output measurement will be different due to error associated with the accelerometer being at a higher temperature. Because the output should not change while the accelerometer is at rest, that is, acceleration is still only gravity regardless of the temperature, it is possible to isolate the output measurement error associated with temperature by finding the difference (or "offset") between the erroneous measurement and the known baseline measurement (gravity in the case of an accelerometer). By conducting this measurement comparison at multiple temperatures, many data points are collected and an offset profile over a range of temperatures can be obtained. The collection of data associating temperatures with specific offset readings can be compiled for each movement detection device during the calibration process. The data can be stored as calibration data in a table for look up or extrapolation, or can be used to define a best fit function. The calibration data can be accessed by a virtual reality, augmented reality, or mixed reality system to obtain an adjusted measurement from a movement detection device given the temperature of the movement detection device and its initial "raw" measurement.

A calibration system and process that improves calibration accuracy is described herein. Known methods of calibrating movement detection devices involve contacting the movement detection device with a thermal probe to introduce heat by conduction or require actively blowing air across the movement detection device to adjust its temperature by convection. Both of these methods can cause the device to move so that a measurement taken from the device during calibration will include an error associated with temperature and an error associated with movement introduced by the measurement method. Because it is not possible to know how much movement is introduced by the measurement method, it is not possible to isolate the error associated with temperature. As a result, the error cannot be accurately removed from the raw output measurement of the device. In virtual, augmented, and mixed reality systems, the accuracy of a measurement taken by a device is critical for determining where to display virtual content to a user with respect to movement between the user and the real or virtual environment. Thus, there exists a need for a highly accurate calibration system and method in a virtual, augmented, or mixed reality device.

Figure 1:
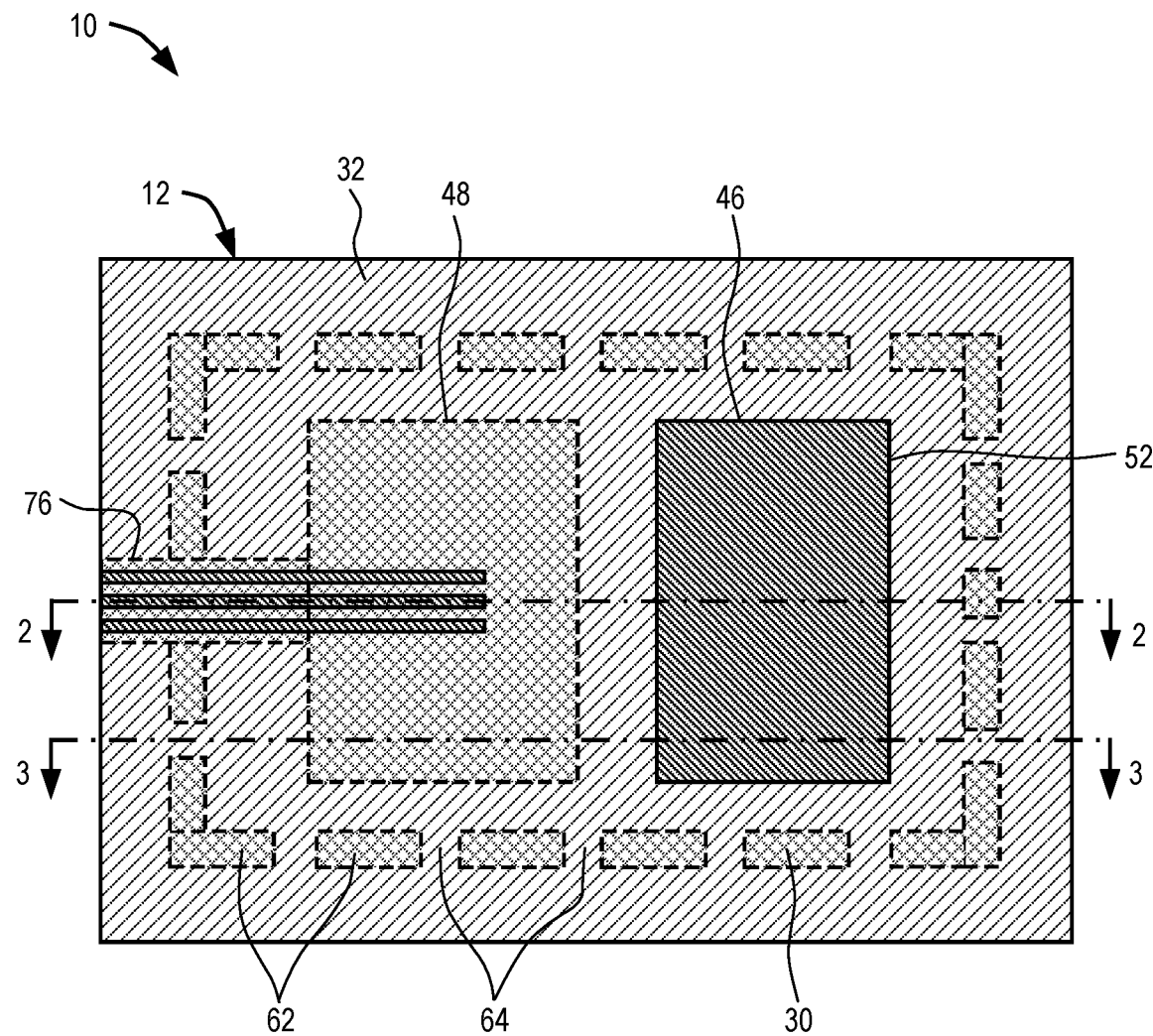
FIG. 1 is a top view in a first plane of an electronics system according to an embodiment of the invention.
Figure 2:
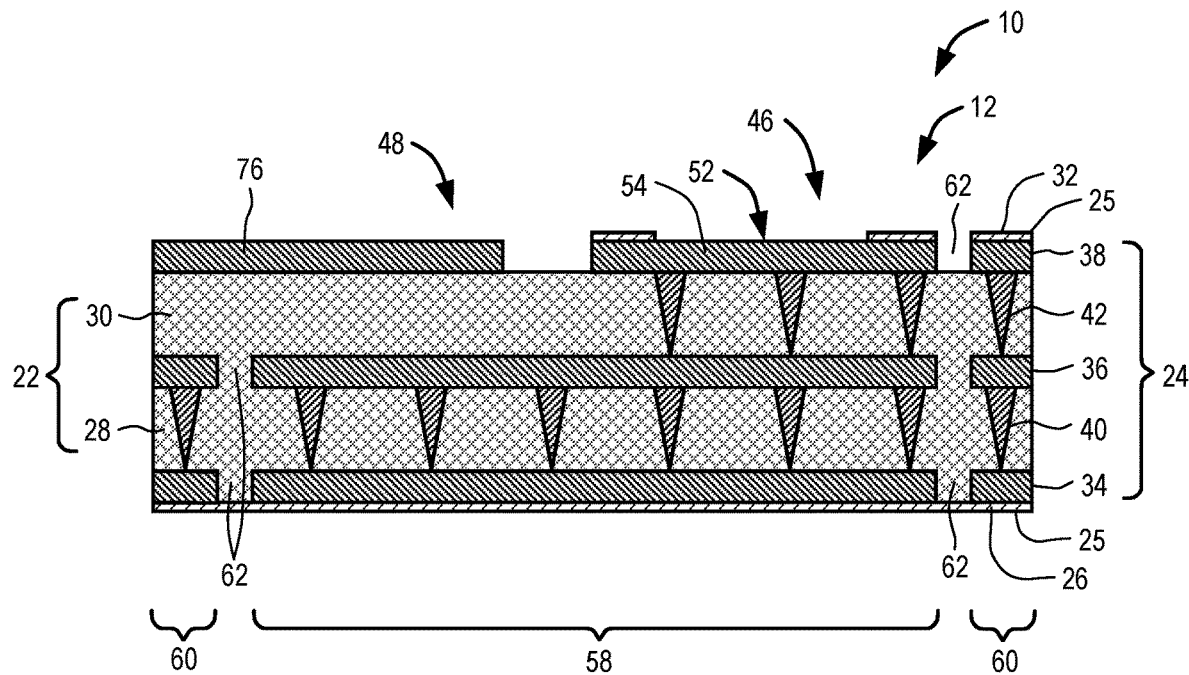
FIG. 2 is a cross-sectional side view of the electronics system in a second plane on 2-2 in FIG. 1.
Figure 3:
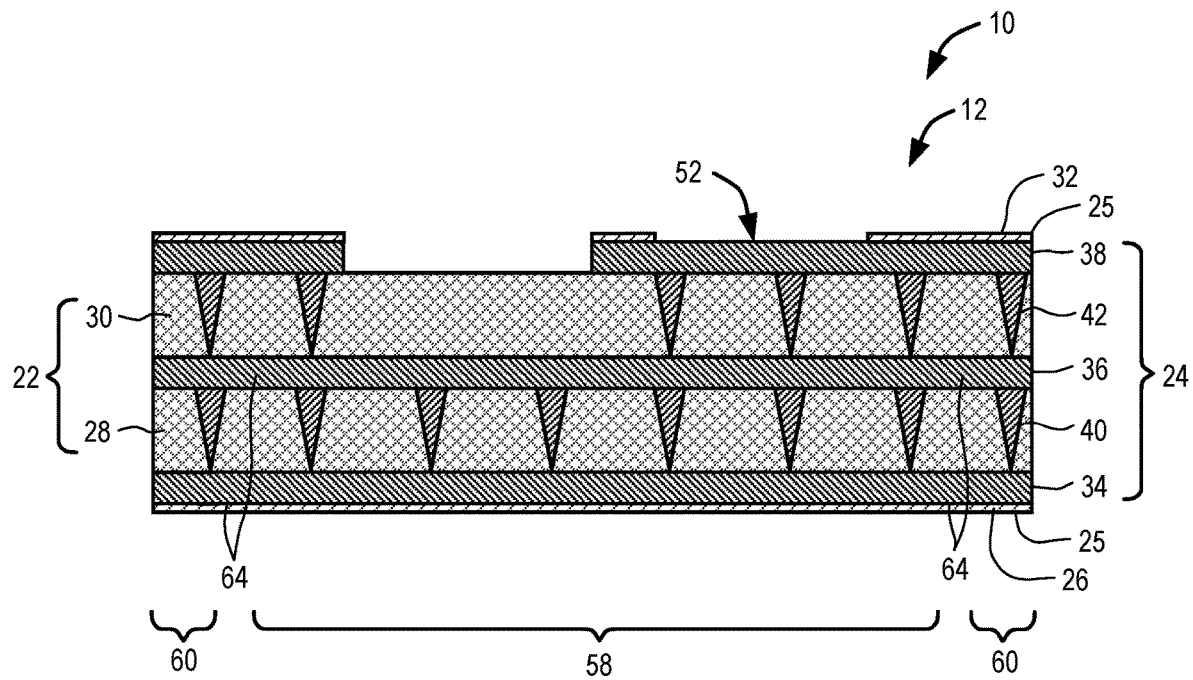
FIG. 3 is a cross-sectional side view of the electronics system in a third plane on 3-3 in FIG. 1.

FIGS. 1, 2 and 3 illustrate an electronics system 10, according to an embodiment of the disclosure. FIG. 1 is a top view of an example configuration of a board 12 in the electronics system 10. FIG. 2 is a cross-sectional side view on 2-2 in FIG. 1. FIG. 3 is a cross-sectional side view on 3-3 in FIG. 1. The electronics system 10 includes a board 12 made up of multiple layers of different materials. The layers and various features disposed therein provide particular functions during calibration and use of an electronics device 14 (discussed with respect to FIGS. 4 and 5), such as a sensor or sensor suite, connected to the board 12.

The board 12 is constructed from structural material 22, such as FR4 dielectric, and a thermally and electrically conductive material, such as metal components 24. Metal components 24 may include a copper material. The metal of the metal components 24 is more thermally conductive, and therefore has a higher thermal heat transfer capacity, than the structural material 22. The metal of the metal components 24 is electrically conductive and the structural material 22 is electrically insulating.

Multiple layers of structural material 22 can be included in the board 12. As shown in the example of FIGS. 2 and 3, two structural layers 28 and 30 can be provided. The metal components 24 are disposed between the layers of structural material 22. For example, the metal components 24 can include first, second and third metal layers 34, 36 and 38 separated by the first and second structural layers 28 and 30. The board 12 further includes top and bottom insulating layers 32 and 26 that cover the first and third metal layers 34 and 38. The top and bottom insulating layers 32 and 26 can include an electrically insulating solder resist material 25.

The metal components 24 also include first and second sets of vias 40 and 42, respectively. The first set of vias 40 connects portions of the first metal layer 34 to portions of the second metal layer 36. The second set of vias 42 connects portions of the second metal layer 36 to portions of the third metal layer 38. The metal layers 34, 36 and 38 are thereby electrically and thermally connected to one another. The metal layers 34, 36 and 38 together with the first and second sets of vias 40 and 42 form a thermal conduit of thermally conductive material that connect a first region 46 of the thermal conduit to a second region 48 of the thermal conduit.

Portions of the third metal layer 38 are isolated as metal lines 76 to function as traces for electrical signals. These metal lines 76 can be isolated from each other and from other metal components 24 such that each line is surrounded by non-conductive material, such as dielectric structural material 22 and insulating solder resist material 25. One of skill in the art will appreciate that more or fewer than three metal lines 76 may be provided depending on the design of the electronic device 14 that is mounted to the board 12 at the second region 48. The metal lines 76 may be disposed in one or more of the metal layers in the board 12. Additionally, while the lines 76 are shown as exposed parts of the metal component 24, portions of the metal lines 76 can also be coated with the insulating solder resist material 25.

The metal components 24 further include a thermal interface 52. The thermal interface 52 is an area of the third metal layer 38 at the first region 46 that has been exposed by removing a portion of the top insulating layer 32. The thermal interface 52 is an upper surface 54 of third metal layer 38 that is exposed and is configured to contact part of an electronic device calibration station 80. The upper surface 54 forms only a portion of an upper surface of the board 12, with the remainder of the upper surface consisting of an upper surface of the structural layer 30 and insulating solder resist layer 32.

Referring to FIGS. 1 and 2 in combination, the first, second, and third metal layers 34, 36, 38 have an inner portion 58 and an outer portion 60. The structural material 22 forms a plurality of barriers 62 that distinguish the inner portion 58 from the outer portion 60. The barriers 62 act as thermal barriers to prevent heat from conducting from the inner portion 58 to the outer portion 60 of the second metal layer 36, or at least substantially slow the transfer of heat so that the outer portion 60 is kept cooler than the inner portion 58. Additional electronic components can be connected to the board 12. Such components can be connected to the board 12 at the outer portion 60 to keep the components from experiencing high heat during the calibration process.

Referring to FIGS. 1 and 3 in combination, it can be seen that the first, second, and third metal layers 34, 36, 38 also have connecting portions 64 that connect the inner portion 58 to the outer portion 60. The connecting portions 64 ensure that the metal layers are electrically grounded such that there is an equal reference voltage between the inner portion 58 and the outer portion 60.

Referring to FIGS. 1 and 2 in combination, it can be seen that similar thermal barriers 62 are formed at one or more positions within the first, second and third metal layers 34, 36 and 38 (FIG. 1) and that each metal layer has respective portions 64 connecting inner and outer regions thereof. The barriers 62 prevent, or at least slow heat transfer from the inner portion 58 to the outer portion 60 to protect other components attached to the board 12 from experiencing high temperatures during the calibration of electronics device 14.

Figure 4:
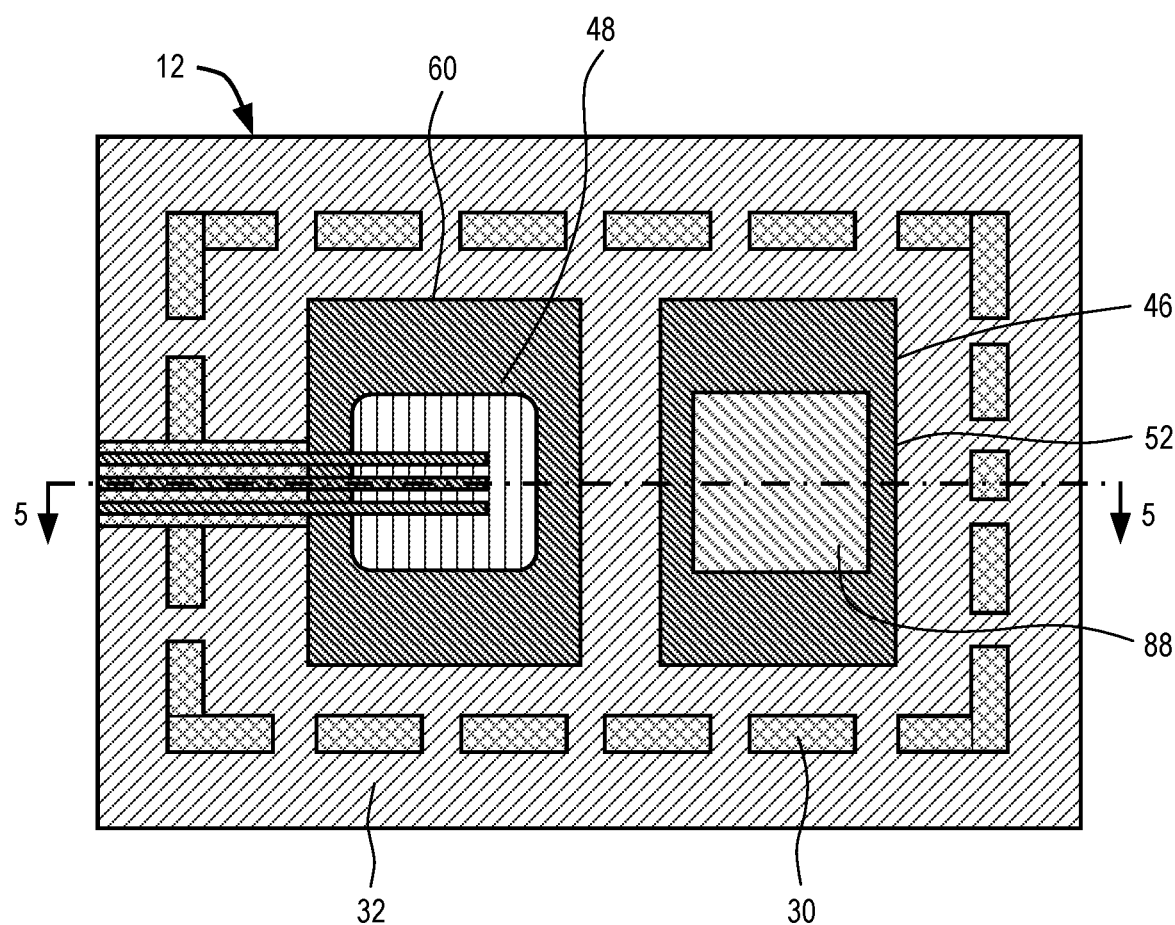
FIG. 4 is a side view similar to FIG. 1 and further illustrates an electronics device forming part of the electronics system.
Figure 5:
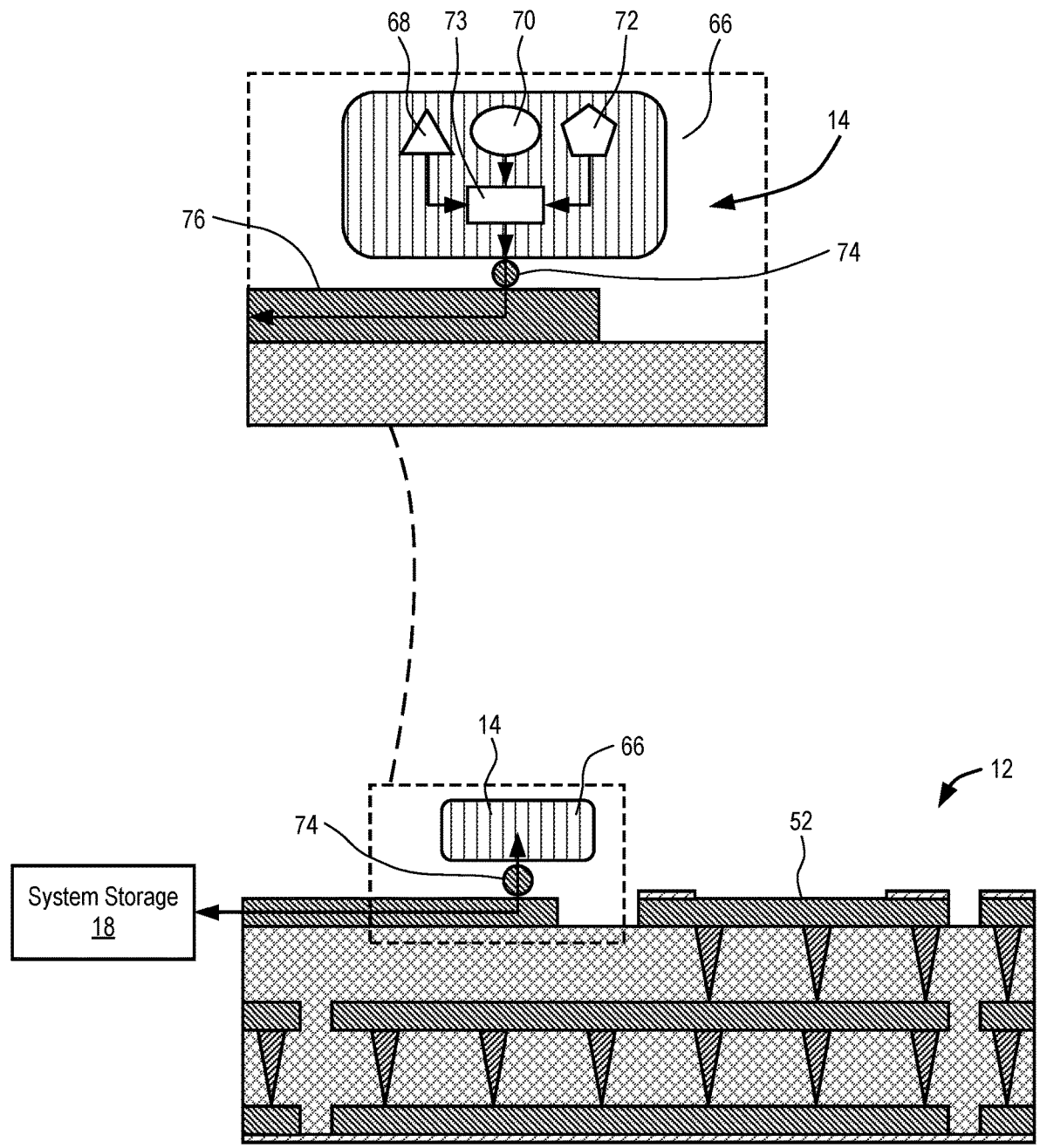
FIG. 5 is cross-sectional side view on 5-5 in FIG. 4 showing with to a close-up detailed view of the electronics device.

Referring to FIGS. 4 and 5, the electronics system 10 further includes an electronics device 14 and a system storage 18. The electronics device 14 is mounted to an upper surface of the board 12 through connections 74. The electronics device 14 and the thermal interface 52 are within the barriers 62 that define the inner portion 58. The electronics device 14 is mounted above the second region 48 of the thermal conduit described above.

The electronics system 10 further includes a board interface 16 that is attached to the board 12 and connected to the measurement devices in the electronics device 14. The electronics device 14 includes a structural body 66 and a number measurement devices in the structural body 66. The measurement devices include a temperature sensor 68 and two movement detection device in the form of an accelerometer 70 and a gyroscope 72. Although two movement detection devices are used for purposes of this embodiment, it may be possible to implement aspects of the invention using only one measurement device. It may for example be possible to calibrate an electronics device having only a gyroscope or only an accelerometer. The structural body 66 may, for example, be a silicon or other semiconductor structural body that may be packaged using conventional packaging technologies. The temperature sensor 68, accelerometer 70 and gyroscope 72 are connected through connectors 74 on an upper surface of the board 12 and metal lines 76 in the board 12 to the board interface 16. Data traces from the temperature sensor 68, accelerometer 70, and gyroscope 72 are routed to a microprocessor 73 in the structural body 66 which serves as an input/output interface for the measurement devices. The system storage 18 serves to store calibration data received from the calibration station 80 that is associated with the accelerometer 70 and gyroscope 72. The system storage 18 may, for example, include a solid-state memory. The system storage 18 is shown near the electronics device 14, however, the system storage may be a remote storage, located on a cloud-based storage or on another area of the electronics device such that it is not in contact with the board 12. One of skill in the art will appreciate that the system storage 18 may be located anywhere that is in communication with electronics device 14 to allow for data transfer between electronics device 14 and system storage 18. The system storage 18 includes no calibration data immediately after the electronics system 10 has been assembled (that is, prior to undergoing calibration) but is uniquely associated with the electronics device 14 by enabling data to transfer between the electronics device 14 and the system storage 18.

Figure 6:
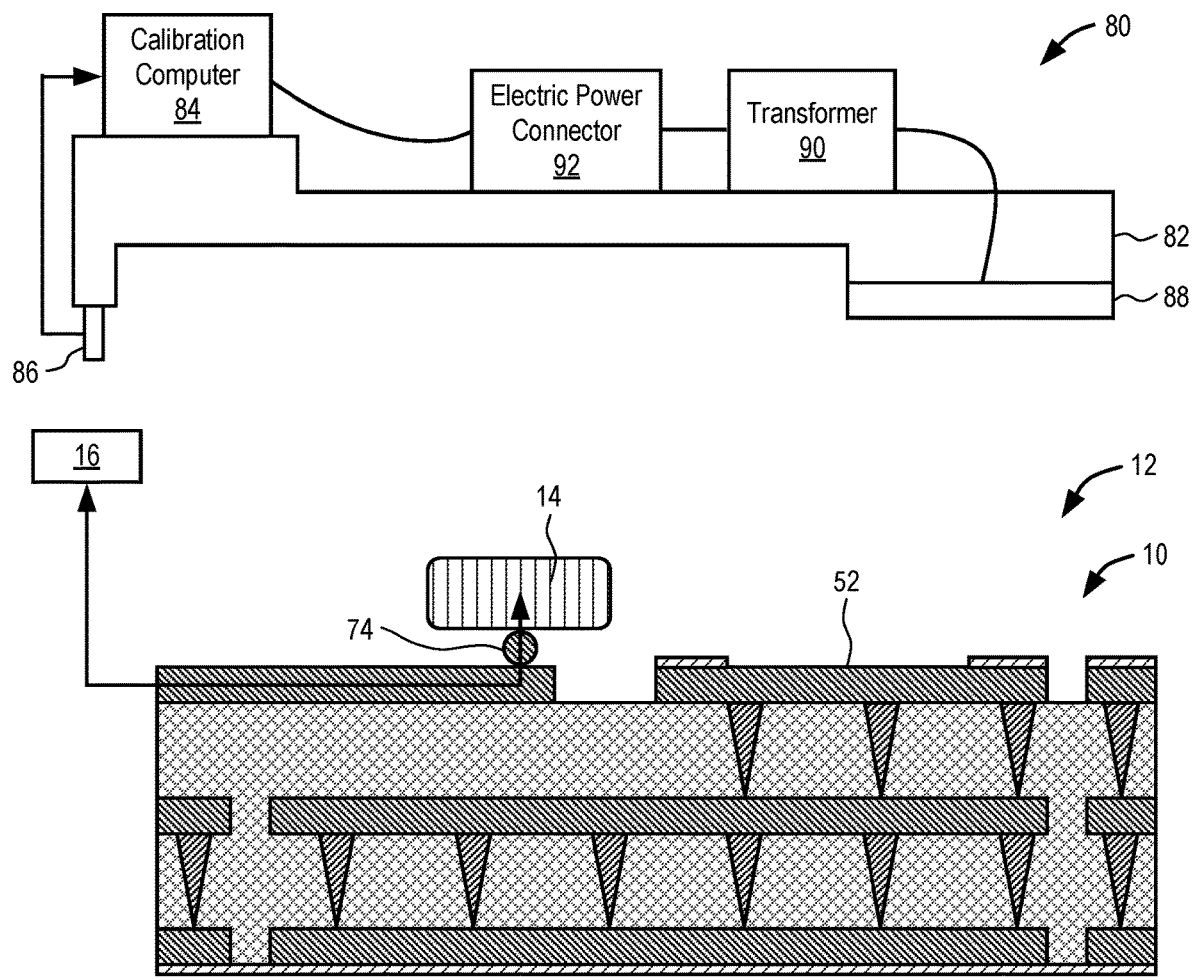
FIG. 6 is a cross-sectional side view of the electronics system further illustrating a calibration station.

FIG. 6 further illustrates a calibration station 80 that is used to calibrate the accelerometer 70 and the gyroscope 72. The calibration station 80 includes a frame 82, a calibration computer 84, a calibration computer interface 86, a thermoelectric device 88, a transformer 90 and an electric power connector 92. The components of the calibration station 80 are mounted in a stationary position to one another via the frame 82. A spacing between the calibration computer interface 86 and the thermoelectric device 88 is the same as a spacing between the board interface 16 and the thermal interface 52. The calibration computer 84 is connected to the calibration computer interface 86 so that signals can transmit between the calibration computer 84 and the calibration computer interface 86. Information from the microprocessor 73 can be accessed by the calibration station 80. The calibration computer 84 is connected to the electric power connector 92 so that power can be provided through the electric power connector 92 to the calibration computer 84. The thermoelectric device 88 is connected through the transformer 90 to the electric power connector 92. The power can be provided by the electric power connector 92 through the transformer 90 to the thermoelectric device 88. The transformer 90 reduces the voltage provided by the electric power connector 92 before providing power to the thermoelectric device 88. The thermoelectric device 88 is preferably a reversible heat pump, such as a thermoelectric cooler, capable of providing heat into the board 12 or drawing heat out of the board 12. The flexibility to achieve a wide range of temperatures on the board 12, and thus at the electronics device 14, can improve calibration accuracy of the electronic device 14.

In use, the electronics system 10 is brought into contact with portions of the calibration station 80. When the electronics system 10 and the calibration station 80 move relatively towards one another, the calibration computer interface 86 connects to the board interface 16 and can begin receiving data from the electronics device 14 at the same time that the thermoelectric device 88 comes into contact with the thermal interface 52. In the embodiment described, the calibration computer interface 86 and the board interface 16 are wired interfaces that come into contact with one another to create a communication link and are releasable from one another to break the communication link. Data is received through a wired communication between the electronics system 10 and the calibration station 80. In another embodiment, the calibration station 80 and the board may include wireless interfaces that create a wireless link for data transfer and the wireless link sis then broken.

Electric power is provided through the electric power connector 92 to the calibration computer 84, which powers the calibration computer 84. Electric power is also provided through the electric power connector 92 and the transformer 90 to the thermoelectric device 88.

The entire electronics system 10 can begin calibration initially at room temperature, e.g. approximately 21° C. The temperature sensor 68 (FIG. 5) provides an output of the temperature to the calibration computer 84. The accelerometer 70 and the gyroscope 72 simultaneously provide outputs to the calibration computer 84 that are associated with the output temperature from the temperature sensor 68. Baseline outputs for the accelerometer and the gyroscope are either known because the device is at rest or are established at a reference temperature, such as at room temperature. These baseline outputs are used later in the calibration process to isolate errors in measurements ("offsets") that are associated with temperature changes of the sensors.

Figure 7:
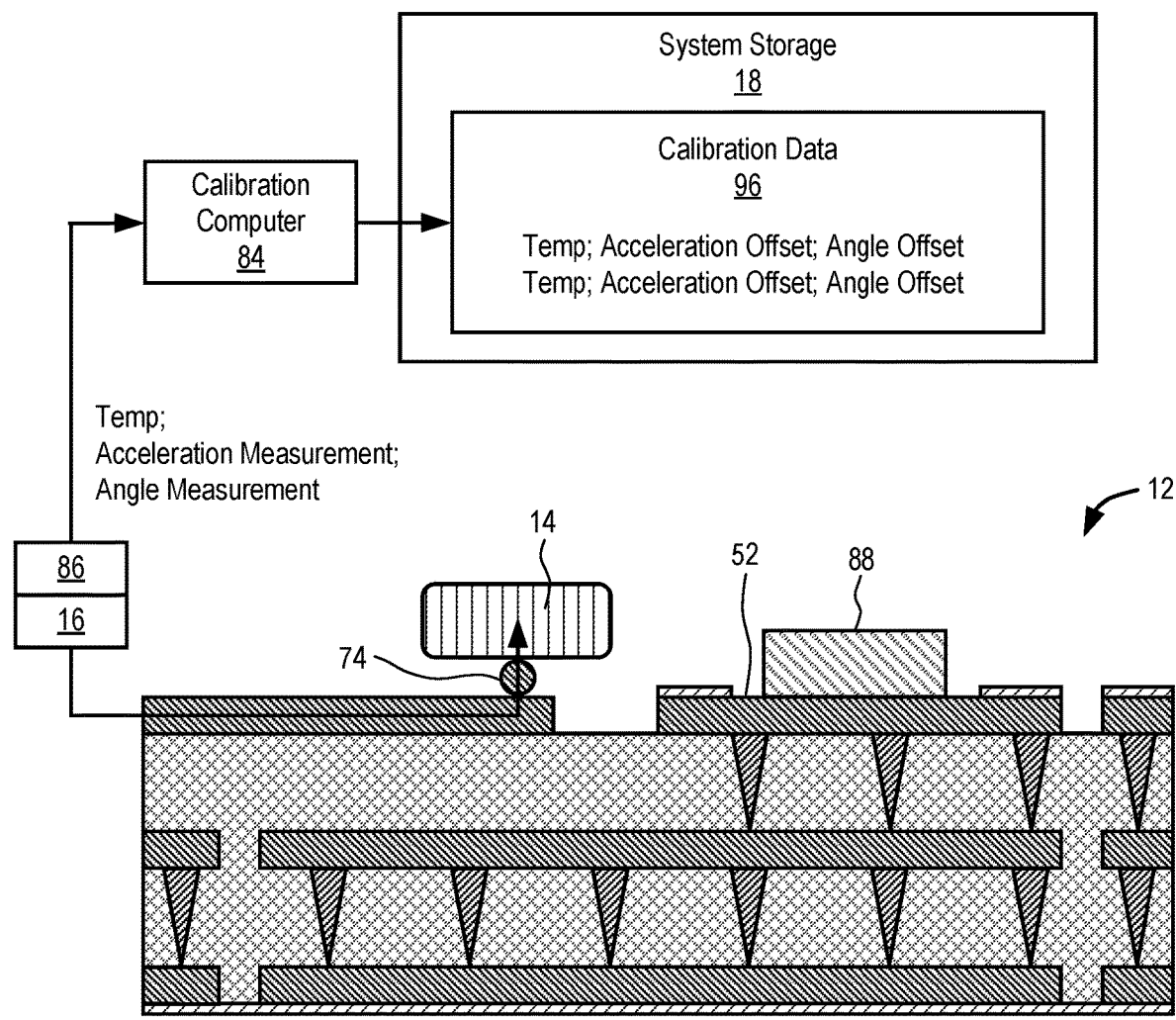
FIG. 7 is a cross-sectional side view of the electronics system further illustrating the use of the calibration station to heat and calibrate the electronics device of the electronics system.

FIG. 7 illustrates that the calibration computer 84 is connected to the system storage 18 and records calibration data 96 in the system storage 18 as the calibration offsets are calculated. A first entry in a table of the calibration data 96 includes the initial temperature (in this example, 21° C.), an acceleration offset (calculated by finding the difference between the acceleration measurement at temperature and the known acceleration), and an angle offset (calculated by finding the difference between the gyroscope measurement at temperature and the known positional information) that are calculated for a given temperature sensor measurement using inputs from accelerometer 70 and gyroscope 72, respectively.

The thermoelectric device 88 has an upper surface that is at a lower temperature than room temperature and a lower surface that is at a higher temperature than room temperature. Heat transfers from the high temperature, lower surface of the thermoelectric device 88 through the upper surface 54 of the thermal interface 52 into the thermal interface 52. The heat transfer is primarily by way of conduction. The heat then conducts through the third metal layer 38 and first and second sets of vias 40 and 42 to the first and second metal layers 34 and 36. The heat then conducts through the first, second and third metal layers 34, 36 and 38 from the first region 46 nearest the heat source outward toward the second region 48. The barriers 62 prevent or at least substantially retard transfer of heat from the inner portion 58 to the outer portion 60.

Heating of the second region 48 causes its temperature to increase. Conduction of heat through the metal layers 34, 36, 38 and the thermal vias 40, 42 happens rapidly while significantly slower conduction of heat occurs in the structural material layers 28, 30. Conduction through top metal layer 38 evenly distributes heat underneath electronics device 14 in the second region 48. The increased temperature of the second region 48 causes heat transfer through conduction by connection 74 and through passive convection of air surrounding the electronics device 14. This method of heating electronics device 14 closely mimics the field conditions that the electronic device 14 will experience. The temperature sensor 68 continues to detect the temperature of the electronics device 14. The calibration computer 84 samples the temperature of the temperature sensor 68 on a predetermined interval, e.g. every five seconds, or more frequently for improved accuracy. The calibration computer 84 also samples outputs from the accelerometer 70 and the gyroscope 72 at the same time that the calibration computer 84 samples a temperature from the temperature sensor 68. The calibration computer 84 then calculates and stores each temperature and each acceleration offset and each angle offset with the calibration data 96. As described herein previously, each temperature is associated with an acceleration offset and an angle offset component within the measurement readings of the accelerometer and gyroscope, respectively. An offset profile can be obtained by measuring outputs of each sensor across a range of temperatures, each time subtracting the known value that the sensor should measure from the actual measurement to calculate error. Each temperature thus has a different acceleration offset and angle offset associated therewith, even though the accelerometer 70 and gyroscope 72 remain stationary from one measurement to the next. In some embodiments, multiple measurements are obtained at each temperature and an average offset is calculated for improved accuracy.

When sufficient data is collected, the calibration station 80 is removed from contact with the board 12. The calibration computer interface 86 writes the collected calibration data to the system storage 18 and disconnects from the board interface 16. The thermoelectric device 88 disengages from the thermal interface 52. Heat convects and conducts from the electronics device 14 until the entire electronics device 14 returns to room temperature.

The calibration system and process described above do not require physical contact between the calibration station and the electronics device 14 and furthermore do not require forced convection across electronics device 14. Rather, the electronics device 14 is heated by way of conduction through a permanent connection (connectors 74 and metal lines 76) to the board 12 and by way of passive convection without the need for additional probe contact with or forced air blowing over the electronics device 14. The electronics device 14 can thus be calibrated against temperature without disturbing the accelerometer 70 or the gyroscope 72. This system and process allows for a more accurate offset calibration while mimicking real field conditions of the sensors on board electronics device 14.

Figure 8:
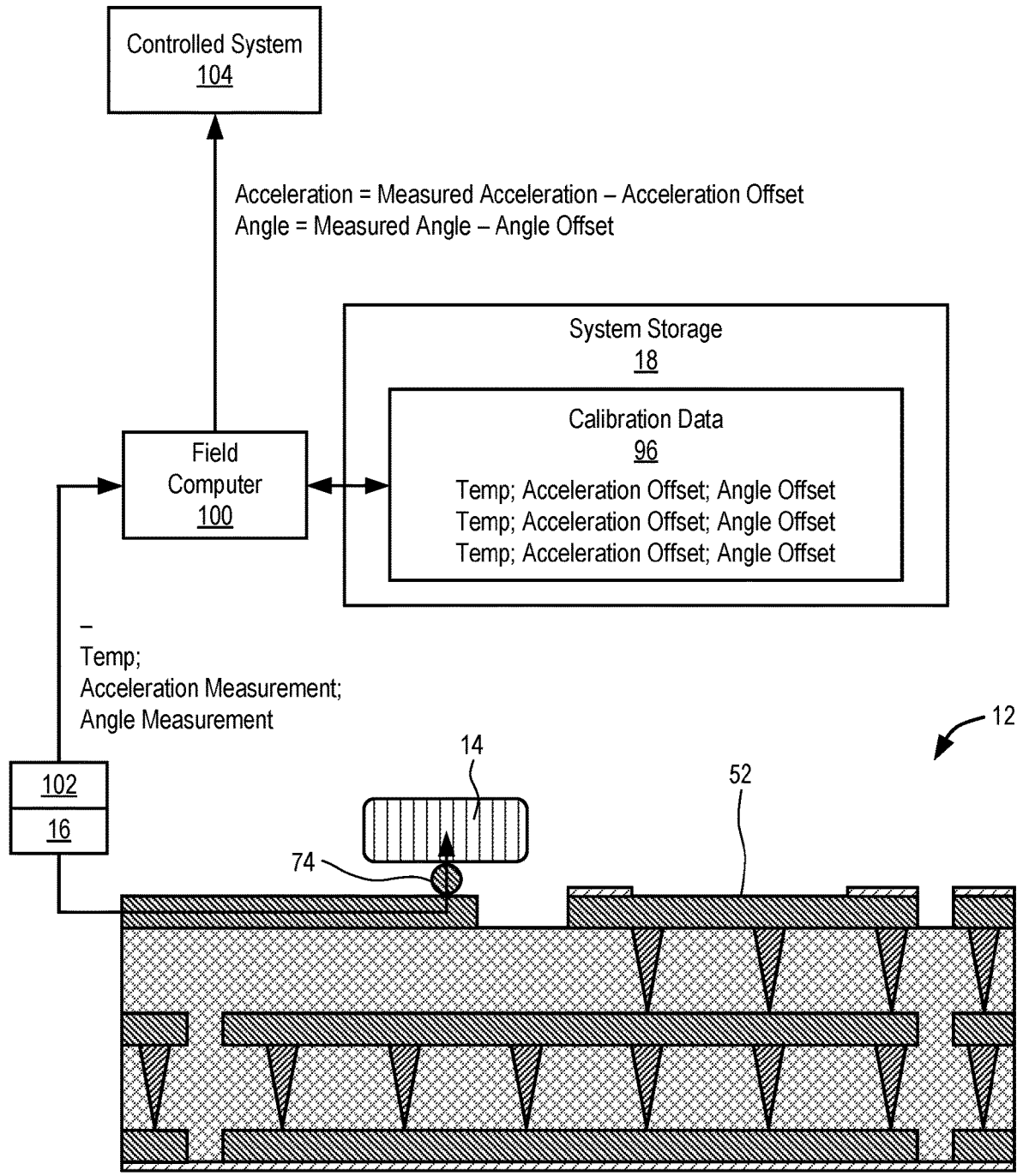
FIG. 8 is cross-sectional side view of the electronics system, further showing a field computer and a controlled system that uses calibration data.

FIG. 8 illustrates the electronics system in conjunction with a field computer 100, a field computer interface 102 and a controlled system 104. The controlled system 104 may be, for example, a virtual reality, augmented reality, or mixed reality device. The field computer 100 is connected to the field computer interface 102. The controlled system 104 is connected to the field computer 100. The field computer 100 may, for example, be a computer that processes movement data of an augmented reality viewing system and the controlled system 104 may be a vision processing system of the viewing device. The field computer 100 is connected to the system storage 18 and has access to the calibration data 96.

In use, the electronics system 10 is moved, e.g. in linear directions or rotational directions. The accelerometer 70 and the gyroscope 72 detect such movement of the electronics system 10. The field computer 100 senses signals received from the temperature sensor 68, accelerometer 70 and gyroscope 72. The field computer 100 uses the temperature detected by the temperature sensor 68 to find a corresponding temperature in the calibration data 96. The calibration data 96 may include the table with data as hereinbefore described or may include a formula, such as a linear regression, representative of the calibration data. The field computer 100 retrieves the acceleration offset and the angle offset in the calibration data 96 corresponding to the temperature measured by the temperature sensor 68. The field computer 100 then adjusts the acceleration detected by the accelerometer 70 by the acceleration offset (acceleration=measured acceleration−acceleration offset). The field computer 100 also adjusts an angle measured by the gyroscope 72 by the angle offset corresponding to the temperature (adjusted angle=measured angle−angle offset). The field computer 100 then provides the adjusted acceleration and the adjusted angle to the controlled system 104. The controlled system 104 utilizes the adjusted acceleration and the adjusted angle in one or more formulas. By way of example, the controlled system 104 adjusts placement of a rendered image in an augmented reality or mixed reality viewing device according to a placement formula that uses the adjusted acceleration and the adjusted angle received from the field computer 100.

Figure 9:
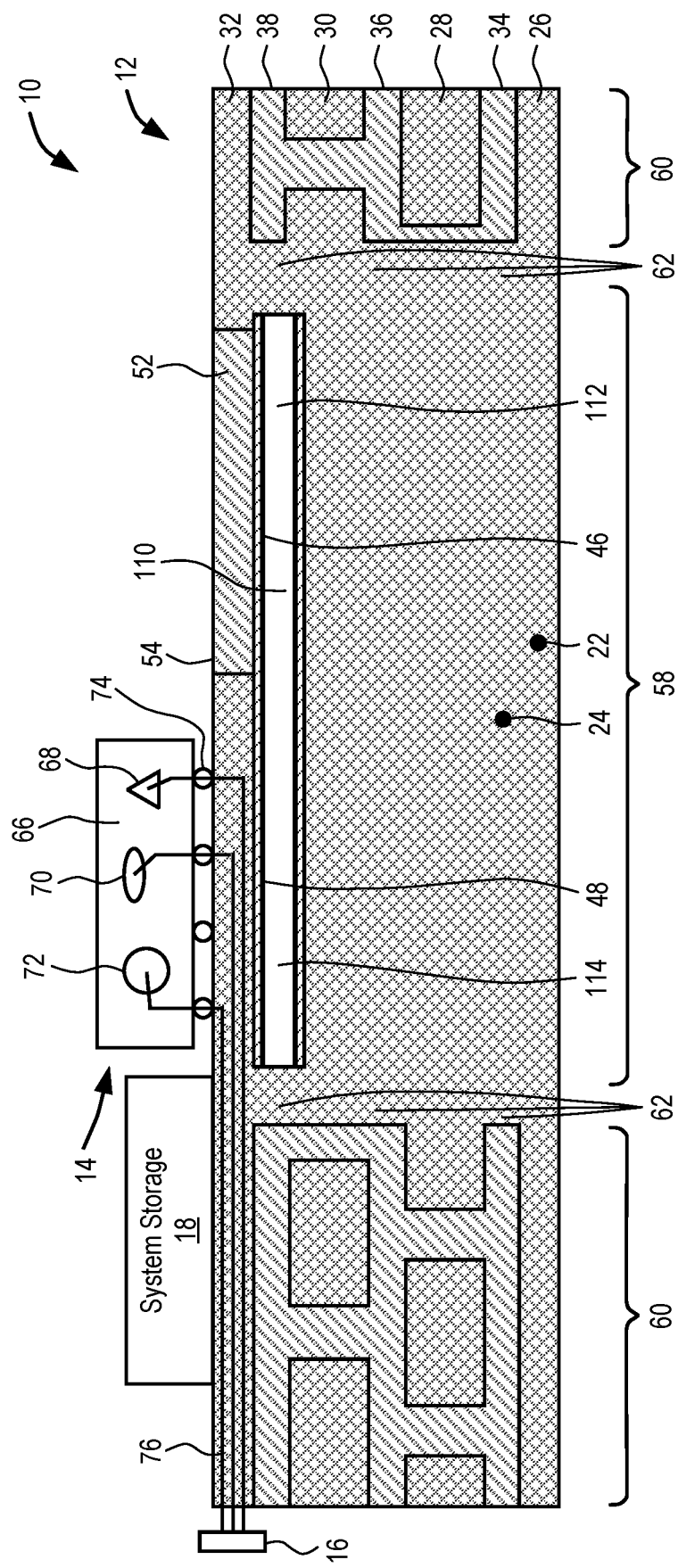
FIG. 9 is a cross-sectional side view of an electronics system according to another embodiment of the invention.

FIG. 9 illustrates an alternate embodiment wherein a thermal conduit is provided by any known heat spreader that can be built into a chip. In some embodiments, the heat spreader can be a heat pipe 110. The heat pipe 110 has an evaporator end 112 and a condenser end 114. The evaporator end 112 is located against or in close proximity to the thermal interface 52 and the condenser end 114 is located in close proximity to the electronics device 14. In use, the thermal interface 52 heats a liquid in the heat pipe 110 and evaporates the liquid. The resultant vapor flows from the evaporator end 112 to the condenser end 114 and condenses. The resulting condensed liquid then flows through a wicking system from the condenser end 114 back to the evaporator end 112.

FIGS. 1 to 8 illustrate one type of thermal conduit consisting of a thermally conductive metal. The design in FIGS. 1 to 8 is relatively inexpensive to manufacture. FIG. 9 illustrates a different type of thermal conduit in the form of a heat pipe. A heat pipe may transfer more heat, through flow, than thermally conductive metal but may be more expensive to manufacture. The thermal conduit provided by the thermally conductive metal in FIGS. 1 to 8 and the thermal conduit provided by the heat pipe in FIG. 9 both have a thermal heat transfer capacity that is higher than a thermal heat transfer capacity of the structural material 22 of the board 12 and both form a thermal path between the surface of the thermal interface 52 and the electronics device 14.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronics system comprising:
    a board that includes:
        a structural material;
        a thermal conduit on the structural material, the thermal conduit having a thermal conductivity that is higher than a thermal conductivity of the structural material and having a first region, a second region, and a connecting portion connecting the first region to the second region;
        a thermal interface on the structural material, the thermal interface having a thermal heat transfer capacity that is higher than the thermal heat transfer capacity of the structural material and being attached to the first region of the thermal conduit, the thermal interface having a surface that is exposed for making temporary contact with a thermal device;
    an electronics device mounted to the board at the second region of the thermal conduit, the thermal conduit forming a thermal path between the surface of the thermal interface and the electronics device; and
    a movement detection device in the electronics device;
    a board interface that is attached to the board and connected to the measurement devices in the electronics device;
    a system storage; and
    calibration data on the system storage, the calibration data including:
        a first temperature of the movement detection device;
        a first output from the movement detection device recorded against the first temperature; and
        a second temperature of the movement detection device that is different than the first temperature;
        a second output from the movement detection device recorded against the second temperature; and
        a field computer interface connected to the board interface, the storage device being connected through the field computer interface and the board interface to the electronics device.

2. The electronics system of claim 1, wherein the thermal conduit includes a metal conductor.

3. The electronics system of claim 2, wherein the thermal conduit includes at least two metal layers that are separated by a layer of the structural material.

4. The electronics system of claim 3, wherein the thermal conduit includes at least one metal via connecting the layers to one another.

5. The electronics system of claim 4, wherein the thermal conduit includes a plurality of metal vias connecting the layers to one another.

6. The electronics system of claim 2, wherein the metal conductor is made of a metal that is more thermally conductive than the structural material.

7. The electronics system of claim 2, wherein the board has at least one metal layer having an inner portion and an outer portion and the structural material forms a barrier between the inner portion and the outer portion, the inner portion forming the thermal conduit, and the thermal interface and the electronics device being located over the inner portion.

8. The electronics system of claim 7, wherein the metal layer is more electrically conductive than the structural material.

9. The electronics system of claim 7, wherein the structural material forms a plurality of barriers between the inner portion and the outer portion, wherein the barriers are alternated with portions of the metal layer that connect the inner portion and the outer portion to one another.

10. The electronics system of claim 1, wherein the movement detection device is an accelerometer.

11. The electronics system of claim 1, wherein the movement detection device is a gyroscope.

12. The electronics system of claim 1, further comprising: a temperature detector in the electronics device.

13. The electronics system of claim 12, further comprising:
    a field computer,
    the calibration computer interface and the board interface connecting the field computer to the movement detection device and the temperature detector; and
    a controlled system connected to the field computer.

* * * * *